(12) United States Patent
Eldridge et al.

(10) Patent No.: US 8,513,942 B1
(45) Date of Patent: Aug. 20, 2013

(54) METHOD OF FORMING A PROBE SUBSTRATE BY LAYERING PROBE ROW STRUCTURES AND PROBE SUBSTRATES FORMED THEREBY

(75) Inventors: Benjamin N. Eldridge, Danville, CA (US); Gaetan L. Mathieu, Varennes (CA)

(73) Assignee: FormFactor, Inc., Livermore, CA (US)

( * ) Notice: Subject to any disclaimer, the term of this patent is extended or adjusted under 35 U.S.C. 154(b) by 391 days.

(21) Appl. No.: 12/974,152

(22) Filed: Dec. 21, 2010

Related U.S. Application Data

(63) Continuation of application No. 12/710,500, filed on Feb. 23, 2010, now abandoned.

(60) Provisional application No. 61/289,919, filed on Dec. 23, 2009.

(51) Int. Cl.
*G01R 1/06* (2006.01)
*G01R 31/20* (2006.01)

(52) U.S. Cl.
USPC ............... 324/149; 324/754.03; 324/754.14

(58) Field of Classification Search
USPC ................................ 324/149, 754.03, 754.14
See application file for complete search history.

(56) References Cited

U.S. PATENT DOCUMENTS

| | | | |
|---|---|---|---|
| 5,621,333 A | 4/1997 | Long et al. | |
| 6,627,980 B2 * | 9/2003 | Eldridge | 257/678 |
| 6,835,898 B2 * | 12/2004 | Eldridge et al. | 174/267 |
| 7,477,065 B2 * | 1/2009 | Lee et al. | 324/755.08 |
| 2007/0152685 A1 * | 7/2007 | Eldridge et al. | 324/754 |
| 2008/0238458 A1 * | 10/2008 | Eldridge | 324/754 |

* cited by examiner

*Primary Examiner* — Bot Ledynh
(74) *Attorney, Agent, or Firm* — Kirton McConkie

(57) ABSTRACT

A probe head can comprise a substrate and electrically conductive structures extending from opposite surfaces of the substrate. The probe head can be made by forming frame structures each comprising a frame to which a row of the conductive structures is coupled. The frame structures can be placed in a stack. A compressible shim or a curable adhesive can be provided between adjacent frames in the stack to control a distance between the contact ends of the conductive structures in adjacent rows of the conductive structures. The frames can include cavities that form a mold while the frames are in the stack, and the substrate can be formed by introducing a moldable material into the mold. After the moldable material hardens, the frame can be removed, leaving the conductive structures embedded in the substrate.

12 Claims, 31 Drawing Sheets

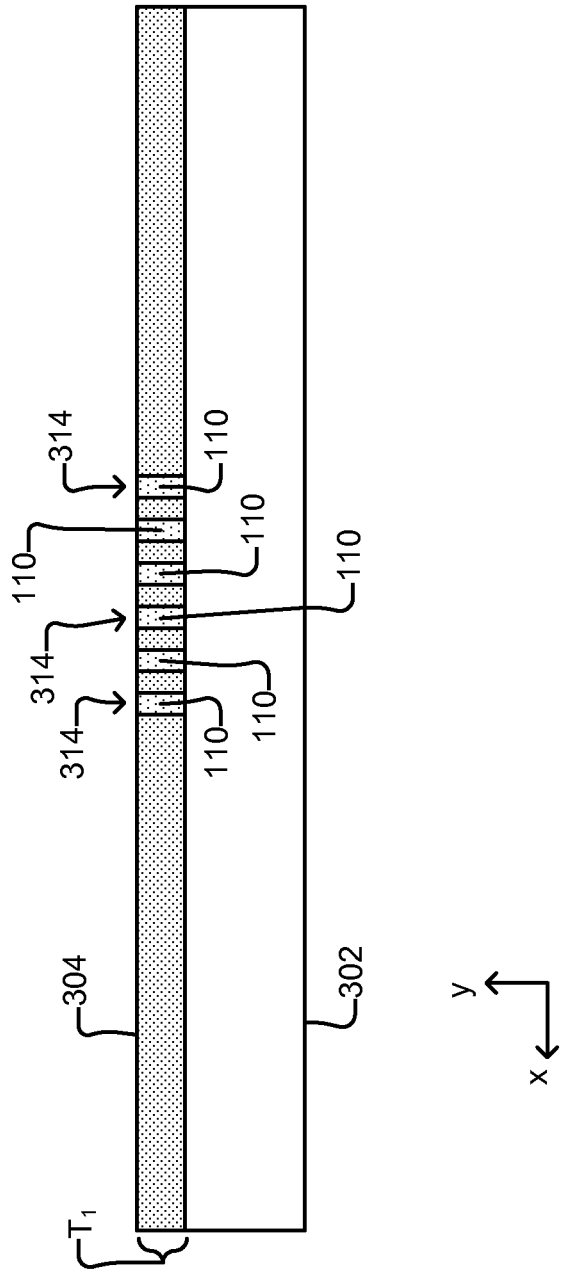

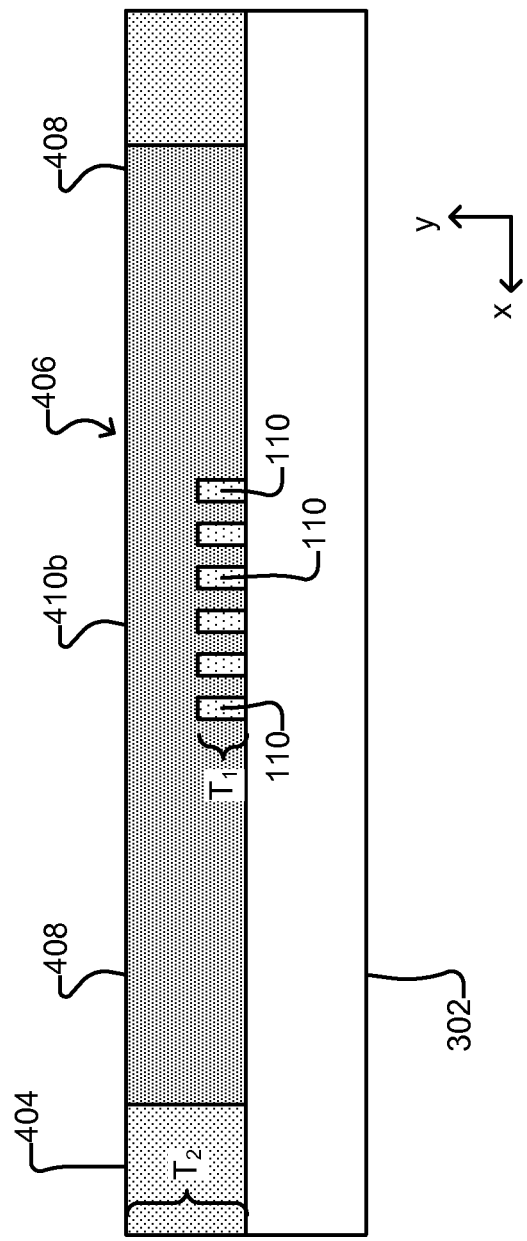

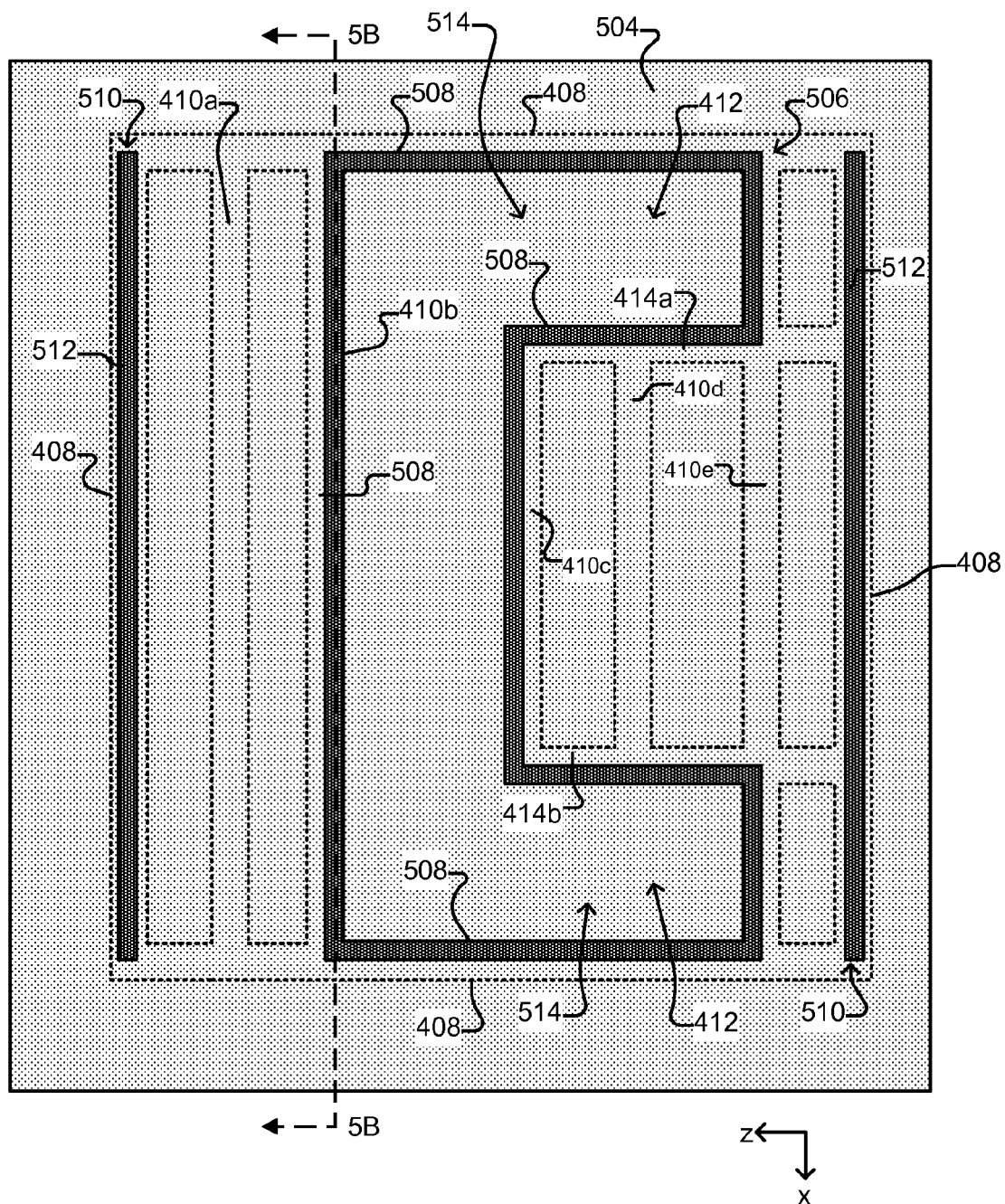

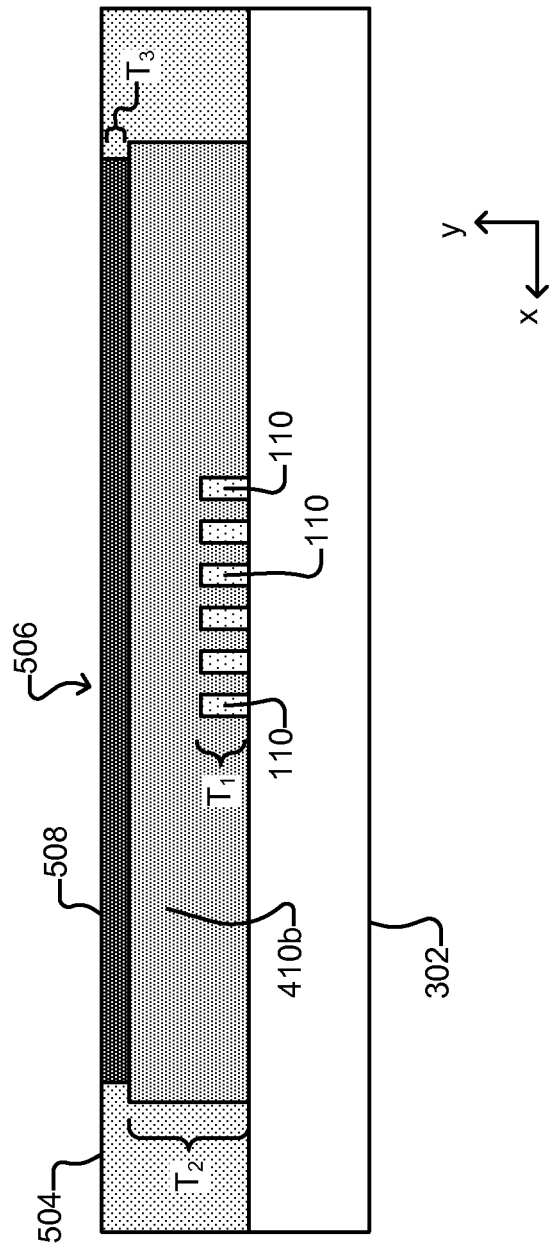

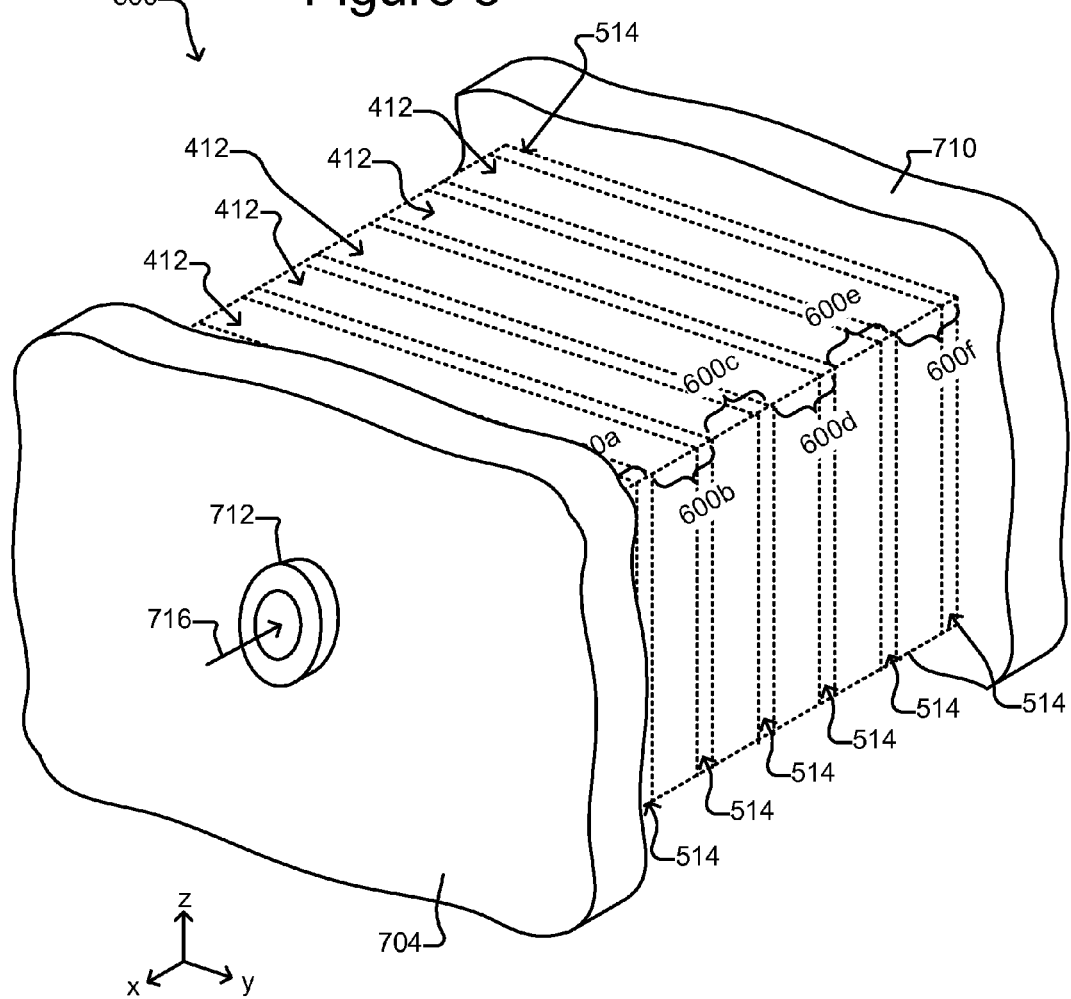

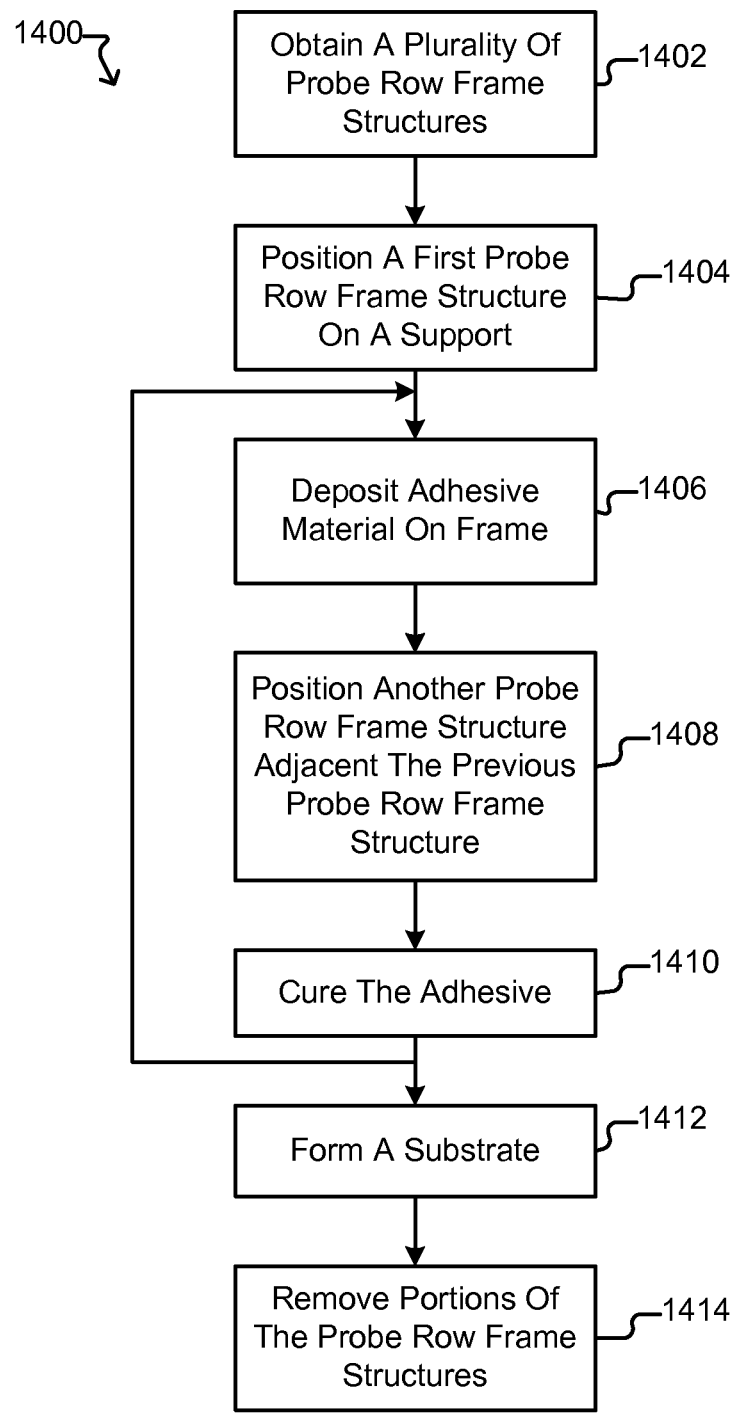

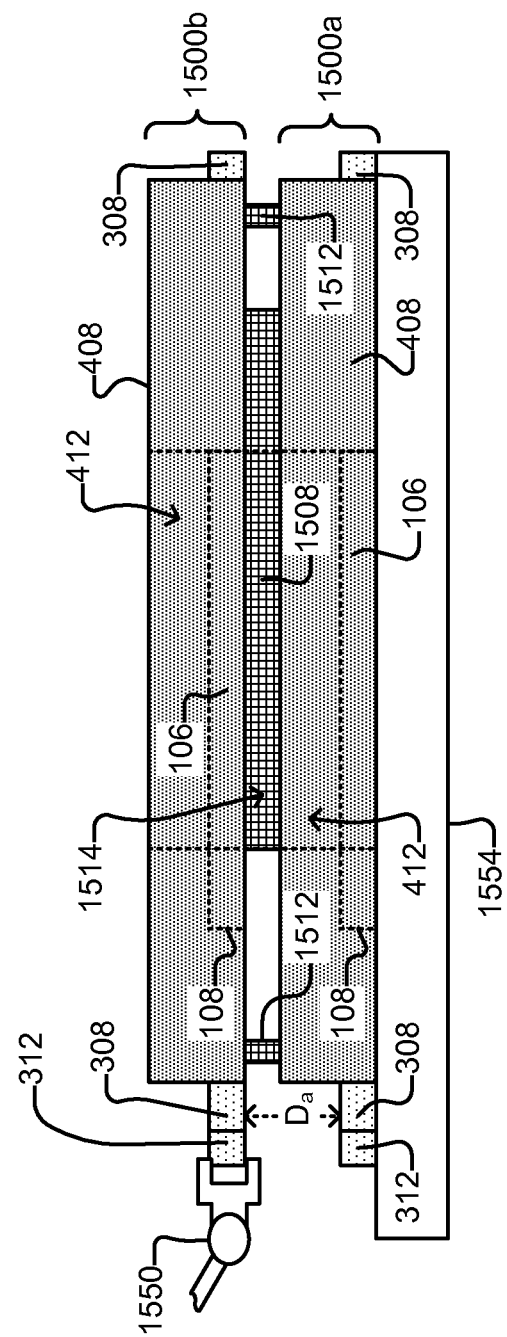
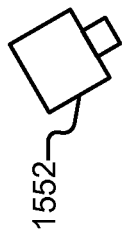
Figure 16

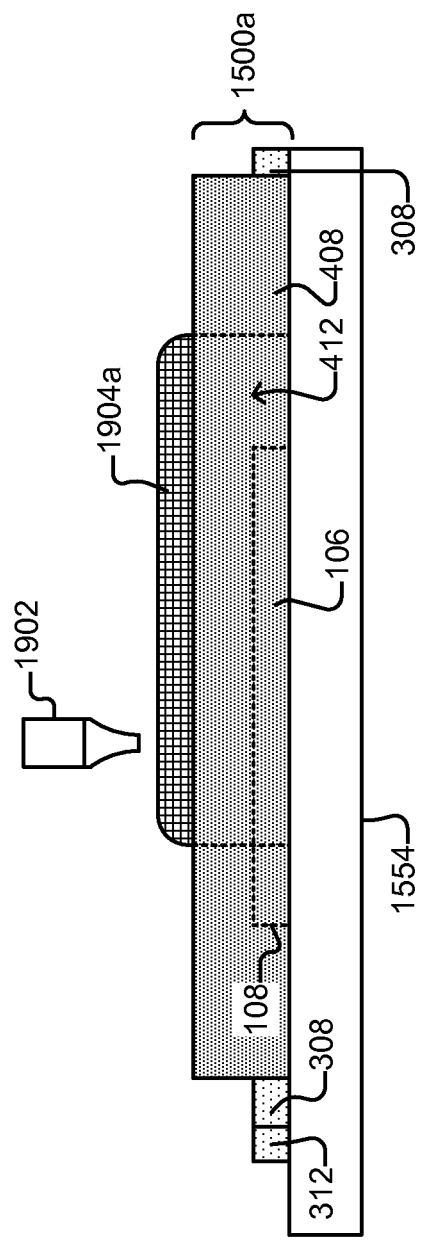
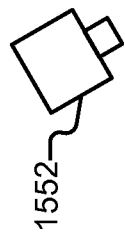
Figure 19

METHOD OF FORMING A PROBE SUBSTRATE BY LAYERING PROBE ROW STRUCTURES AND PROBE SUBSTRATES FORMED THEREBY

CROSS REFERENCE TO RELATED APPLICATIONS

This application is a continuation of U.S. patent application Ser. No. 12/710,500, filed Feb. 23, 2010 (pending), and this application also claims the benefit of U.S. provisional patent application Ser. No. 61/289,919 filed Dec. 23, 2009. The foregoing applications bearing Ser. Nos. 12/710,500 and 61/289,919 are incorporated herein by reference in their entirety.

BACKGROUND

Devices with electrically conductive spring probes can be used to make pressure based electrical connections with input and/or output terminals of an electronic component and thereby establish pressure based, electrical connections with the electronic component. Embodiments of the inventions disclosed herein include methods of making probe heads having such spring probes and probe heads made using those methods.

SUMMARY

In some embodiments, a method of making a probing device can include obtaining a plurality of probe row structures. Each of the probe row structures can include a frame, a plurality of electrically conductive contact structures coupled to the frame in a pattern in which contact ends of each of the contact structures are disposed in a row, and a compressible shim coupled to the frame. The method can further include disposing the probe row structures into a stack in which the rows of contact ends of the contact structures are in an array, and compressing the stack and thereby compressing the compressible shims of each probe row structure until a distance between outer ones of the rows of the contact ends are a particular distance apart. The method can further include securing the contact structures in place while maintaining the particular distance between the outer ones of the rows, and removing the frames from the contact structures.

In some embodiments, a method of making a probing device can include depositing a first adhesive on a portion of a first probe row frame structure to which a first plurality of electrically conductive contact structures are coupled in a pattern in which contact ends of the first contact structures are disposed in a first row, and positioning a second probe row frame structure to which a second plurality of electrically conductive contact structures are coupled in a pattern in which contact ends of the second contact structures are disposed in a second row. The second frame can be in contact with the first adhesive and the second row of contact ends can be a first distance from the first row of contact ends. The method can further include curing the first adhesive such that the first distance is maintained; securing the contact structures in place; and removing the frames from the contact structures.

In some embodiments, a probing device can include a first substrate, and a plurality of rows of contact structures embedded in the first substrate such that probe portions of the contact structures extend from a first surface of the first substrate, and connector portions of the contact structures extend from a second surface of the first substrate opposite the first surface of the first substrate. The rows of contact structures can be substantially parallel and oriented in a first direction, and each row of contact structures can provide a space transformation in the first direction wherein a distance between the connector portions of adjacent contact structures in one of the rows of contact structures can be greater than a distance between the contact ends of the adjacent contact structures. The probe device can further include a second substrate coupled to the first substrate, and a plurality of rows of connector structures embedded in the second substrate such that coupling portions of the contact structures extend from a first surface of the second substrate and couple with the connector portions of the contact structures. Contact portions of the connectors can extend from a second surface of the second substrate opposite the first surface of the second substrate, and the rows of connectors can be substantially parallel and oriented in a second direction that is substantially perpendicular to the first direction. Each row of conductors can provide a space transformation in the second direction, and a distance between the coupling portions of adjacent contact structures in one of the rows of conductors can be greater than a distance between the contact portions of the adjacent conductors.

BRIEF DESCRIPTION OF THE DRAWINGS

FIG. 3A shows a top view and FIG. 3B shows a side, cross-sectional view of an example in which a row of contact structures, alignment features, and handling features can be formed on a substrate according to some embodiments of the invention.

FIG. 4A shows a top view and FIG. 4B shows a side, cross-sectional view of an example in which a frame can be formed on the row of contact structures according to some embodiments of the invention.

FIG. 5A shows a top view and FIG. 5B shows a side, cross-sectional view of an example in which compressible shims can be formed on the frame according to some embodiments of the invention.

FIG. 8 illustrates a mold formed by the stack of probe row structures according to some embodiments of the invention.

FIG. 14 illustrates an example of an alternative process for making the probe head of FIGS. 1A and 1B according to some embodiments of the invention.

FIG. 16 shows an example of adhering a second probe row frame structure to the first probe row frame structure in a desired spaced relationship according to some embodiments of the invention.

FIG. 19 shows an example of overfilling a cavity in a first probe row frame structure with a substrate material according to some embodiments of the invention.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on," "attached to," or "coupled to" are used herein, one object (e.g., a material, a layer, a substrate, etc.) can be "on," "attached to," or "coupled to" another object regardless of whether the one object is directly on, attached, or coupled to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

Figure 1A:
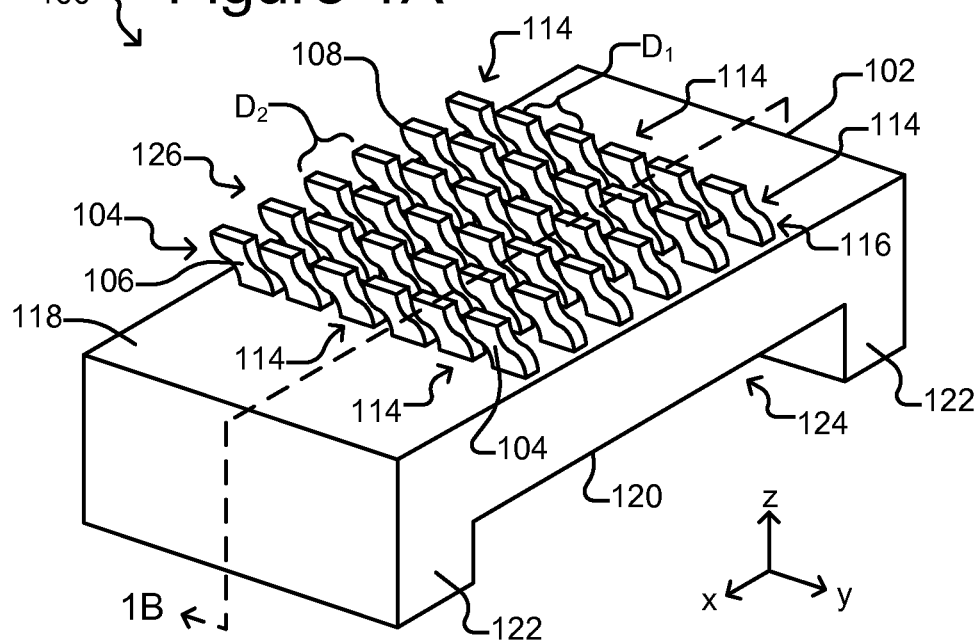
FIG. 1A illustrates a perspective view and FIG. 1B illustrates a side, cross-sectional view of a probe head according to some embodiments of the invention.
Figure 1B:
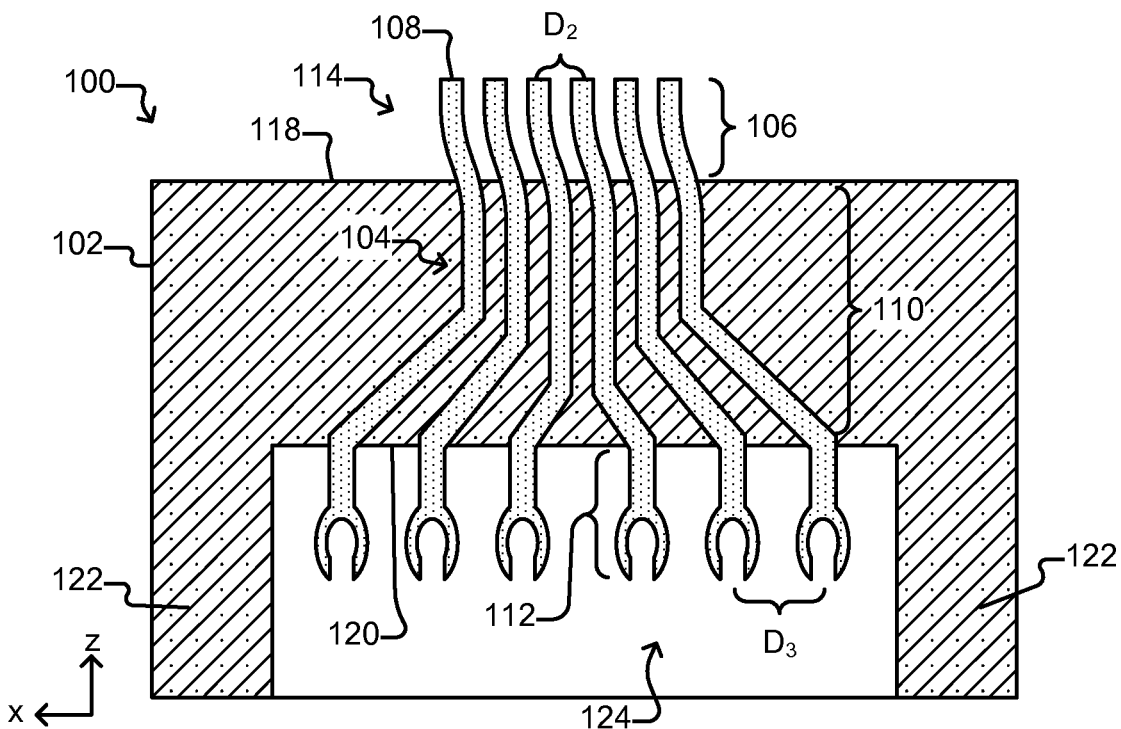

FIGS. 1A and 1B illustrate an example of a probe head 100 comprising a group 126 of contact structures 104 embedded in a probe substrate 102 according to some embodiments of the invention. As will be seen, the probe head 100 can be made by making the contact structures 104 in rows 114 in which the contact structures 104 are held together by a frame. The rows 114 of contact structures 104 can then be placed into a stack, and the stack can be compressed until there is a desired distance between the rows 114 of the contact structures 104. The probe substrate 102 can then be formed around the contact structures 104, and the frame can be removed. Before discussing a detailed example of making the probe head 100, a brief description of the probe head 100 is provided according to some embodiments of the invention as follows.

In some embodiments, as shown in FIGS. 1A and 1B, the probe head 100 can comprise contact structures 104 embedded in the probe substrate 102. As best seen in FIG. 1B, each contact structure 104 can comprise a probe portion 106, a body portion 110, and a connector portion 112. Each contact structure 104 can be integrally formed and can thus be a single, integral structure. As illustrated in FIGS. 1A and 1B, the probe portions 106 can extend from a first surface 118 of the probe substrate 102, and the connector portions 112 can extend from a second surface 120 of the probe substrate 102 that can be opposite the first surface 118. As also illustrated, the body portions 110 can be embedded in the probe substrate 102. As shown, the probe substrate 102 can include extensions 122 that extend from the second surface 120. In such an embodiment, the second surface 120 can be in a space 124 between the extensions 122. In some embodiments, however, the probe substrate 102 does not include extensions 122 or space 124. Regardless, the probe substrate 102 can be rigid and can thus comprise hard and/or rigid materials.

As best seen in FIG. 1B, each body portion 110 can flare out such that the connector portions 112 of at least some of the contact structures 104 are spaced apart a distance $D_3$ in a first direction (e.g., along the "x" axis) that is greater than a distance $D_2$ in the first direction (e.g., along the "x" axis) between contact ends 108 of at least some of the probe portions 106. This can provide a space transformation of the contact structures 104 in the first direction. As can be seen in FIG. 1A, the contact ends 108 can be spaced apart a distance $D_1$ in a second direction (e.g., along the "y" axis), which can be generally in the same plane as but perpendicular to the first direction (e.g., the "x" axis) as shown in FIG. 1A). Although not illustrated in FIGS. 1A and 1B, the connector portions 112 of the contact structures 104 can be spaced apart the distance $D_1$ in the second direction (e.g., along the "y" axis) such that there is no space transformation of the contact structures 104 in the second direction. As will be discussed, the probe head 100 can be made in a manner that allows the distance $D_1$ and/or distance $D_2$ to be particularly small (e.g., forty microns or less).

The probe portions 106 can be electrically conductive probes that can be pressed against terminals (not shown) or other contact structures (not shown) of a first electronic device (not shown) to establish pressure based electrical connections with the first electronic device. At least the probe portions 106 of the contact structures 104 can be resilient, having spring-like properties (e.g., exhibiting primarily elastic behavior in response to a force). For example, the probe portions 106 can flex or move in response to the contact ends 108 of the probe portions 106 being pressed against such terminals (not shown) or other contacts (not shown) of the first electronic device (not shown) while generating a spring-like force against the terminals or contacts. In this way, pressure-based electrical connections can be established between the contact structures 104—which can be electrically conductive—and the first electronic device (not shown). In some embodiments, the contact ends 108 can be made to wipe or scrub outer non-conductive layers on terminals of the first electronic device (not shown) to reach a conductive layer. The connector portions 112 of the contact structures 104 can be configured to connect electrically to other electronic components or other electronic devices (not shown) and thus electrically connect the first electronic device (not shown) to the other electronic components or electronic devices (not shown). The contact structures 104 can comprise one or more materials that provide both electrical conductivity and spring-like mechanical properties to the probe portions 106. Examples of such material include palladium and nickel; alloys of the foregoing including palladium cobalt, palladium nickel, nickel potassium, nickel boron, and nickel iron; any combination of the foregoing; and the like.

Figure 12:
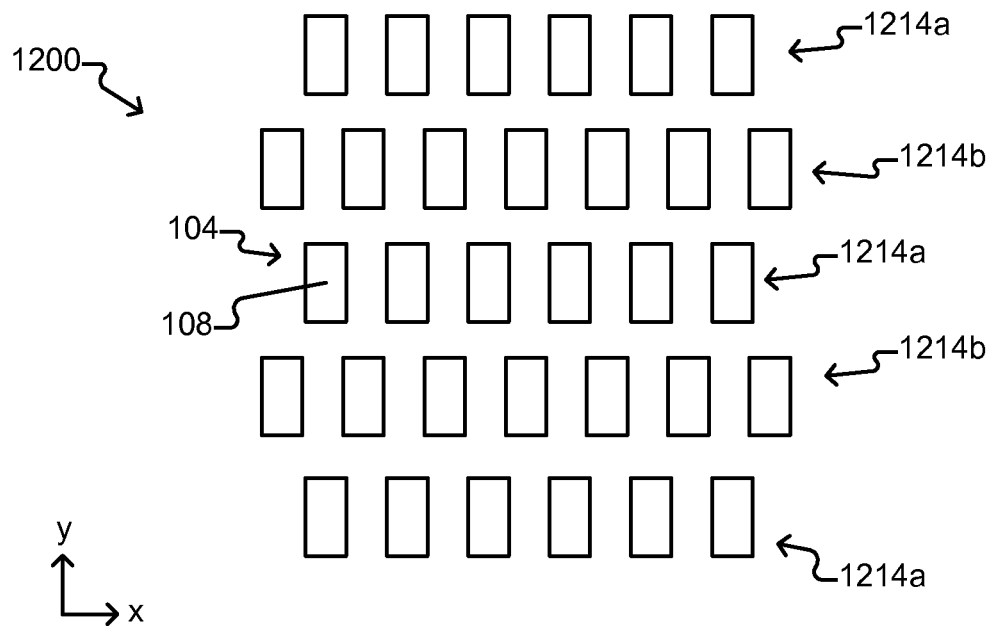
FIG. 12 illustrates an example of an alternative pattern for the contact ends of the group of contact structures of the probe head of FIGS. 1A and 1B according to some embodiments of the invention.
Figure 13:
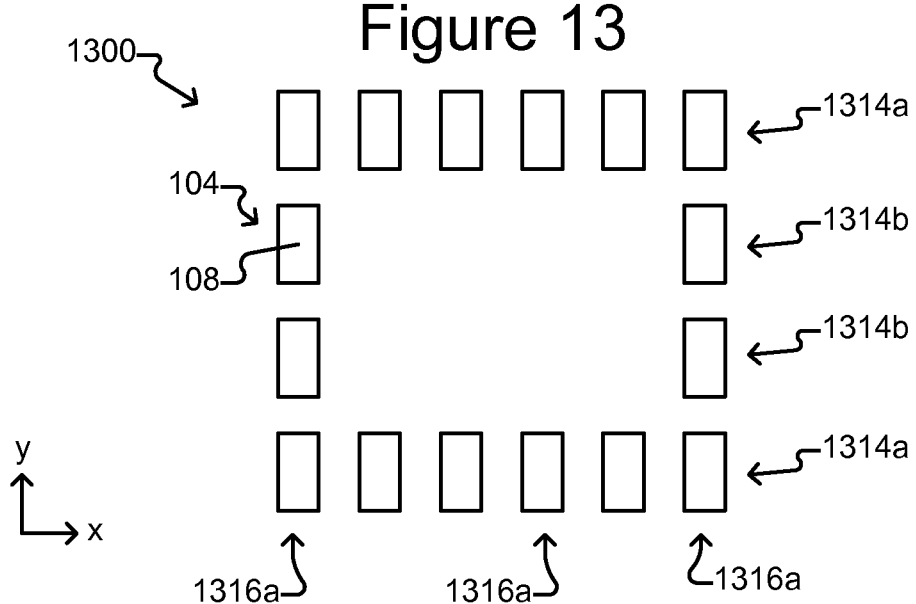
FIG. 13 illustrates another example of an alternative pattern for the contact ends of the group of contact structures of the probe head of FIGS. 1A and 1B according to some embodiments of the invention.

The illustration of the probe head 100 in FIGS. 1A and 1B is an example only, and many variations are possible. For example, the shapes of the contact structures 104 can be different than shown in FIGS. 1A and 1B. For example, the connector portions 112 need not be shaped as clips but can be posts, bumps, pads, or the like. As another example, the connector portions 112 need not extend past the second surface 120. As another example, the number and pattern of contact structures 104 in a row 114 and/or in the group 126 can be different than shown in FIGS. 1A and 1B. For example, FIGS. 12 and 13 illustrate examples of alternative patterns of the contact structures 104 in the group 126. As yet another example, as discussed above, the probe substrate 102 need not include extensions 122. As still another example, the probe substrate 102 need not be box or rectangular shaped but can be other shapes (e.g., a square shape or a cylindrical shape).

Figure 2:
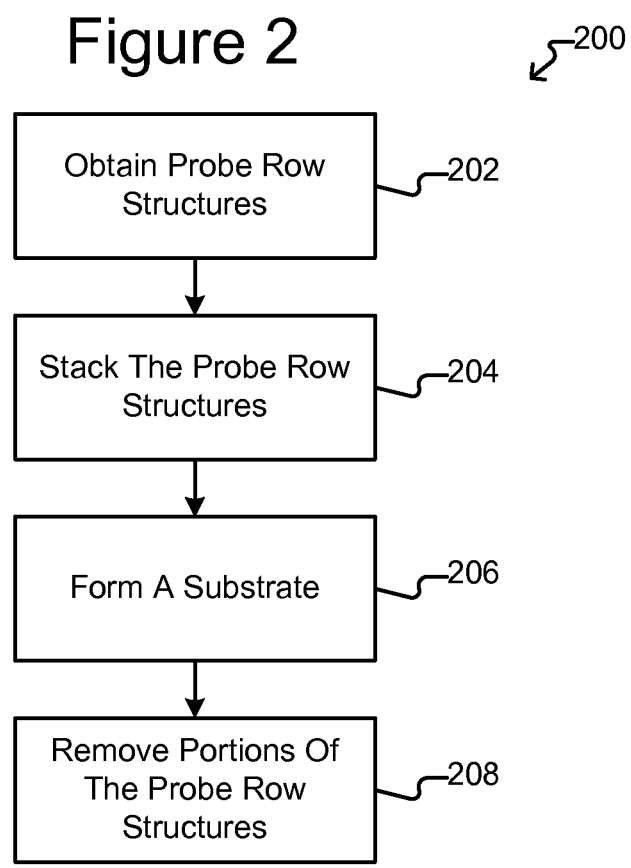
FIG. 2 illustrates an example of a process for making the probe head of FIGS. 1A and 1B according to some embodiments of the invention.

FIG. 2 illustrates an example of a process 200 for making a probe head like the probe head 100 of FIGS. 1A and 1B. For ease of illustration and discussion, the process 200 is discussed below with examples shown in FIGS. 3A through 8 with respect to making the probe head 100 of FIGS. 1A and 1B, but the process 200 is not so limited.

Figure 6A:
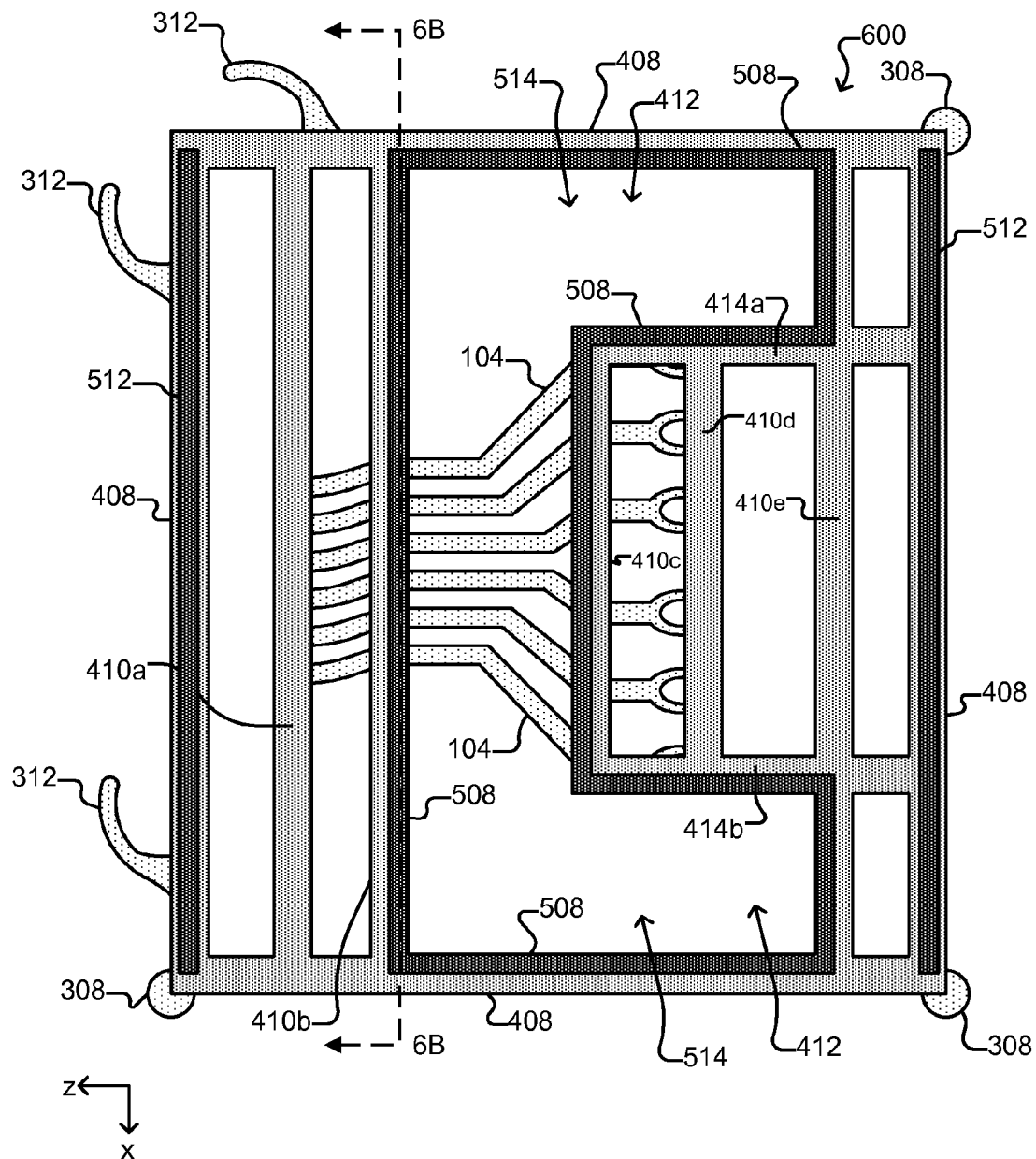
FIG. 6A shows a top view and FIG. 6B shows a side, cross-sectional view of an example in which the row of contact structures, alignment features, handling features, frame, and compressible shims can be removed from the substrate, leaving a probe row structure according to some embodiments of the invention.
Figure 6B:
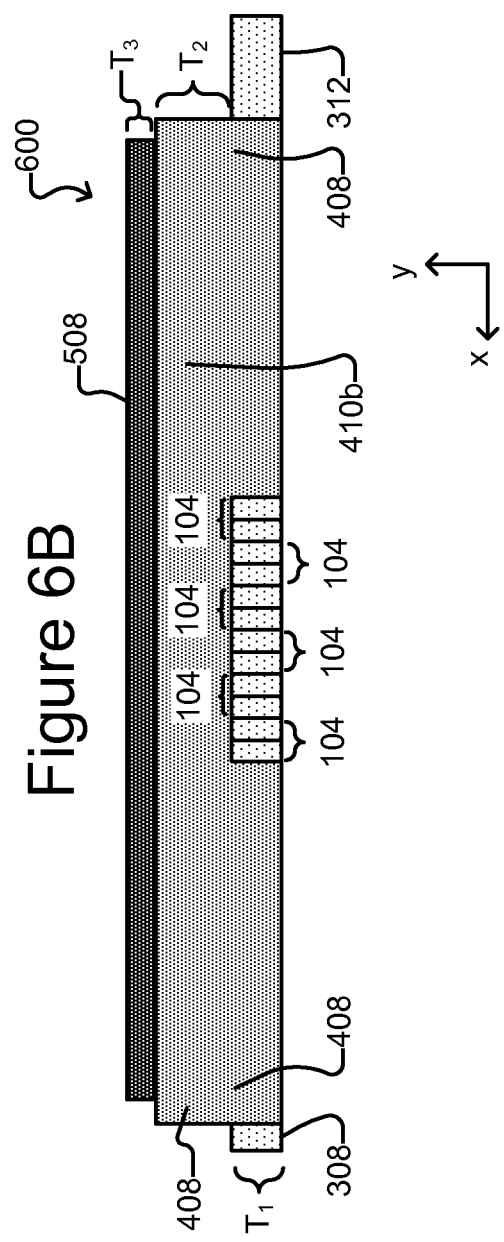

As shown in FIG. 2, a plurality of probe row structures can be obtained at 202. In some embodiments, such probe row structures can be made. FIG. 3A through FIG. 6B illustrate an example in which a probe row structure 500 is made according to some embodiments of the invention. As shown in FIGS. 6A and 6B, a probe row structure 600 can comprise a frame 408 to which a row 114 of contact structures 104 is coupled. One or more compressible shims 508 and 512 can be disposed on the frame 508, which can include one or more handling features 312 and one or more alignment features 308. As will be seen, the handling features 312, which can be structures that protrude from the frame 408, can be grasped and can thus be used to hold and move the probe row structure 600. In some embodiments, the handling features 312 can have spring characteristics. For example, the handling features 312 can be sufficiently thin that they buckle in response to a relatively low force applied to one or more of the handling features 312 to move the probe row structure 600 into and hold the probe row structure 600 in a desired position. As will also be seen, the alignment features 308 can be used to align the probe row structure 600 with other probe row structures 600. Although three handling features 312 and three alignment features 308 are shown, more or fewer handling features 312 and more or fewer alignment features 308 can be used. Also, the particular shapes and positions of the handling features 312 and alignment features 308 shown in FIGS. 6A and 6B are examples only, and other shapes and/or positions can be used.

As illustrated in FIGS. 3A through 5B, the probe row structure 600 can be formed in openings 306, 310, 314, 406, 506, and 510 in successive layers of masking material 304, 404, and 504 on a substrate 302. The substrate 302 can be any material or structure suitable for supporting the masking material 304, 404, and 504 as the probe row structure 600 is formed thereon. Examples of a suitable substrate 302 include a sturdy mass of material with a generally flat surface such as a silicon wafer, a ceramic substrate, or the like. The layers of masking material 304, 404, and 504 can be any material that can be patterned to have openings 306, 310, 314, 406, 506, and 510. For example, the masking material 304, 404, and 504 can be a photoresist material. Each layer of masking material 304, 404, and 504 can be the same material as or different material than the other layers of masking material 304, 404, and 504.

Figure 3A:
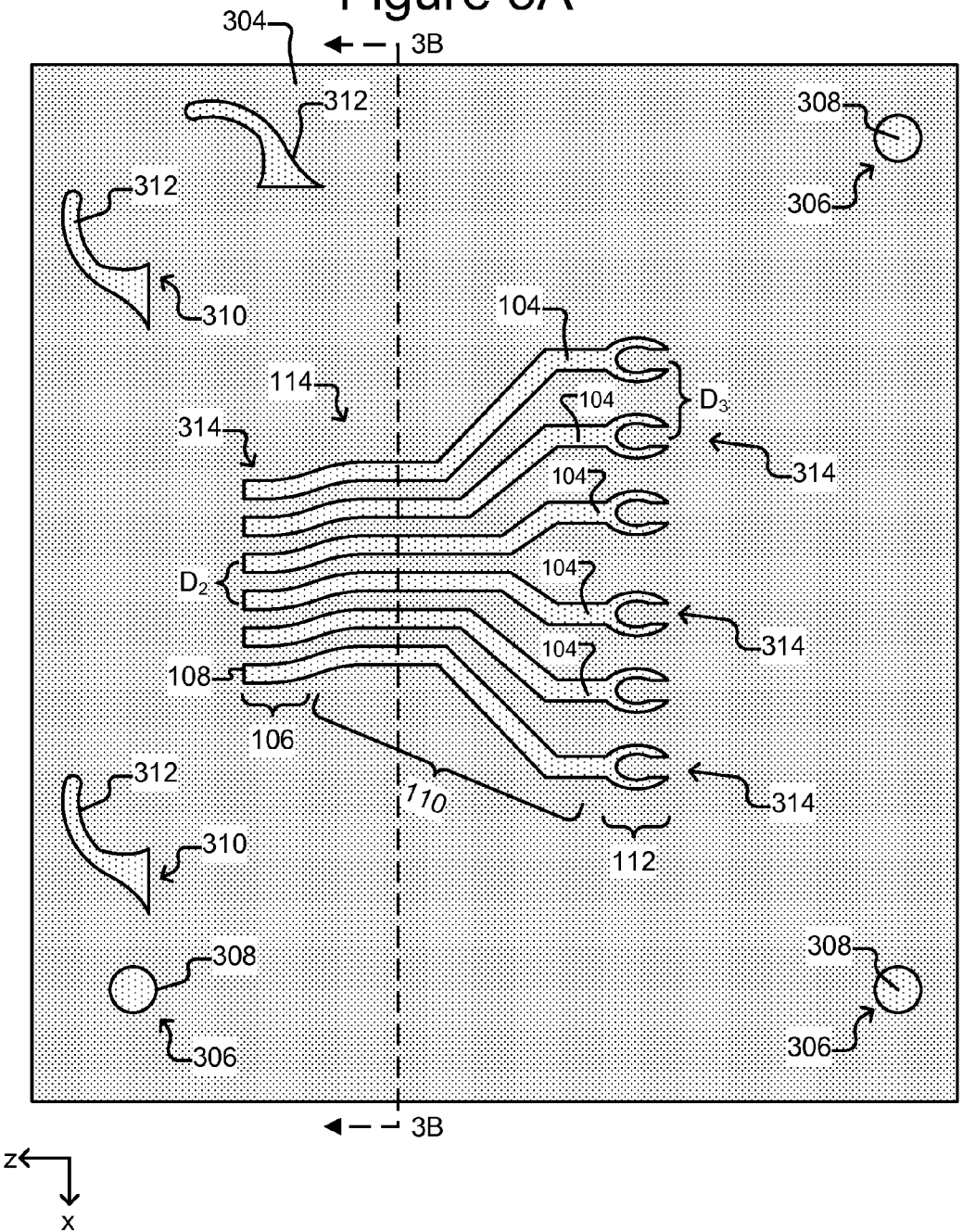

FIGS. 3A and 3B illustrate an example in which a row 114 of contact structures 104 and alignment features 308 and handling features 312 of a probe row structure 600 (see FIGS. 6A and 6B) can be formed in a layer of masking material 304. As shown in FIGS. 3A and 3B, in some embodiments, a layer of masking material 304 can be deposited onto the substrate 302 and patterned to have openings 314 in a desired pattern and shapes of a row 114 of contact structures 104 to be formed on the substrate 302. Portions of the openings 314 at which the contact ends 108 of the contact structures 104 are to be formed can be spaced apart the distance $D_2$ (see FIGS. 1A and 1B). Photolithographic techniques (such as are used in forming integrated circuits on semiconductor dies) can be used to make the openings 314, and the openings 314, including the portions of the openings 314 at which the contact ends 108 are to be formed, can be precisely positioned. For example, as mentioned above, the distance $D_2$ can be forty microns or less in some embodiments, although in other embodiments, the distance $D_2$ can be greater than forty microns. The masking material 304 can also be patterned to have openings 306 and 310 in a desired pattern and shapes of the alignment features 308 and handling features 312 to be formed on the substrate 302. As mentioned above, other alignment and/or handling features can be used and formed on the substrate 302.

Once the openings 306, 310, and 314 are formed in the masking material 304, a row 114 of contact structures 104 can be formed by depositing material or materials (hereinafter "contact material" whether one material or more than one material) into the openings 314 in the masking material 304. In some embodiments different materials can be deposited in layers in the openings 306, 310, and 314. For example, different materials can be deposited in layers in the openings 314, and the contact structures 314 can thus comprise the different materials. Alternatively or in addition, each opening 314 can be replaced by multiple openings (not shown) each comprising a portion of the opening 314, and different portions of each contact structure 104 can be formed in a different one of the multiple openings. In such an embodiment, a different material can be deposited in each of the multiple openings. For example, each opening 314 can be replaced as follows: initially, an opening (not shown) corresponding to all or part of the probe portion 106 can be formed in the masking material 304, and a contact material can be deposited in the opening (not shown) to make all or part of the probe portion 106 of a contact structure 104. Another opening (not shown) corresponding to all or part of the body portion 110 and connector portion 112 can then be formed in the masking material 304 (or alternatively, the masking material 304 can be removed and replaced with new masking material), and another contact material (which can be different than the contact material deposited into the opening (not shown) corresponding to all or part of the probe portion 106) can be deposited in the other opening (not shown) to make all or part of the body portion 110 and connector portion 112 of a contact structure 104. Different portions of each contact structure 104 can thus be made of different contact materials.

Regardless of whether the contact structures 104 comprise one or more contact materials, the contact material(s) can be any material suitable for contact structures 104. For example, the contact material(s) can be electrically conductive, and can have mechanical properties that provide the probe portions 106 with desired mechanical characteristics such as a desired spring constant, hardness, wear resistance, and/or other mechanical characteristics. Examples of the contact material(s) include palladium cobalt and the like (including alloys of the foregoing). Examples of such material include rhodium, palladium, nickel, iridium, and osmium; alloys of the foregoing including, for example, palladium-nickel; any combination of the foregoing; and the like.

The contact material can be deposited into the openings 314 in any suitable manner. In some embodiments, the contact material can be deposited into the openings 314 by electroplating (in which case an electrically conductive seed layer (not shown) can be present on the substrate 302 and exposed by the openings 314). Alternatively, the contact material can be deposited into the openings 314 using other techniques such as electroless plating, chemical vapor deposition, ion plating, sputtering, and the like.

The contact structures 104 can be formed to have a desired thickness $T_1$. For example, in some embodiments, the thickness $T_1$ can be 18-22 microns, although in other embodiments, the thickness $T_1$ can be greater than 20 microns or less than 18 microns. Although not illustrated in the drawings, in some embodiments, the masking material 304 can be deposited with a thickness that is greater than thickness $T_1$, the contact material can be deposited into the openings 314 such that the contact material overfills the openings 314, and an upper portion of the masking material 304 and the contact material can be removed (e.g., by lapping, grinding, or the like) until the masking material 304 and the contact material have a thickness $T_1$ and a generally planar upper surface. Alternatively, the masking material 304 can be deposited onto the substrate 302 with a thickness $T_1$, and the contact material can be deposited in the openings 314 to a thickness $T_1$. Alternatively, the masking material 304 can be deposited onto the substrate 302 with a thickness (not shown) that is greater than $T_1$, and the contact material can be deposited into the openings 314 to a thickness $T_1$, which can be less than the thickness (not shown) of the masking material 304.

The alignment features 308 and handling features 312 can be formed in a similar manner. For example, the masking material 304 can be patterned to further include openings 308 in the desired shapes and locations of the alignment features 308 and openings 310 in the desired shapes and locations of the handling features 312. The alignment features 308 can be formed by depositing material or materials into the openings 306, and the handling features 312 can be formed by depositing material or materials into the openings 310. The material or materials of the alignment features 308 and the handling features 312 can be any suitable material including without limitation any of the materials identified above as examples of the contact material. Moreover, the material or materials of the alignment features 308 can be the same as or different than the material or materials of the handling features 312, which can be the same as or different than the contact material deposited in the openings 314 to form the contact structures 114. Regardless, the material or materials of the alignment features 308 and the handling features 312 can be deposited using any suitable technique including without limitation any of the techniques identified above as techniques for depositing the contact material into the openings 314.

Figure 4A:
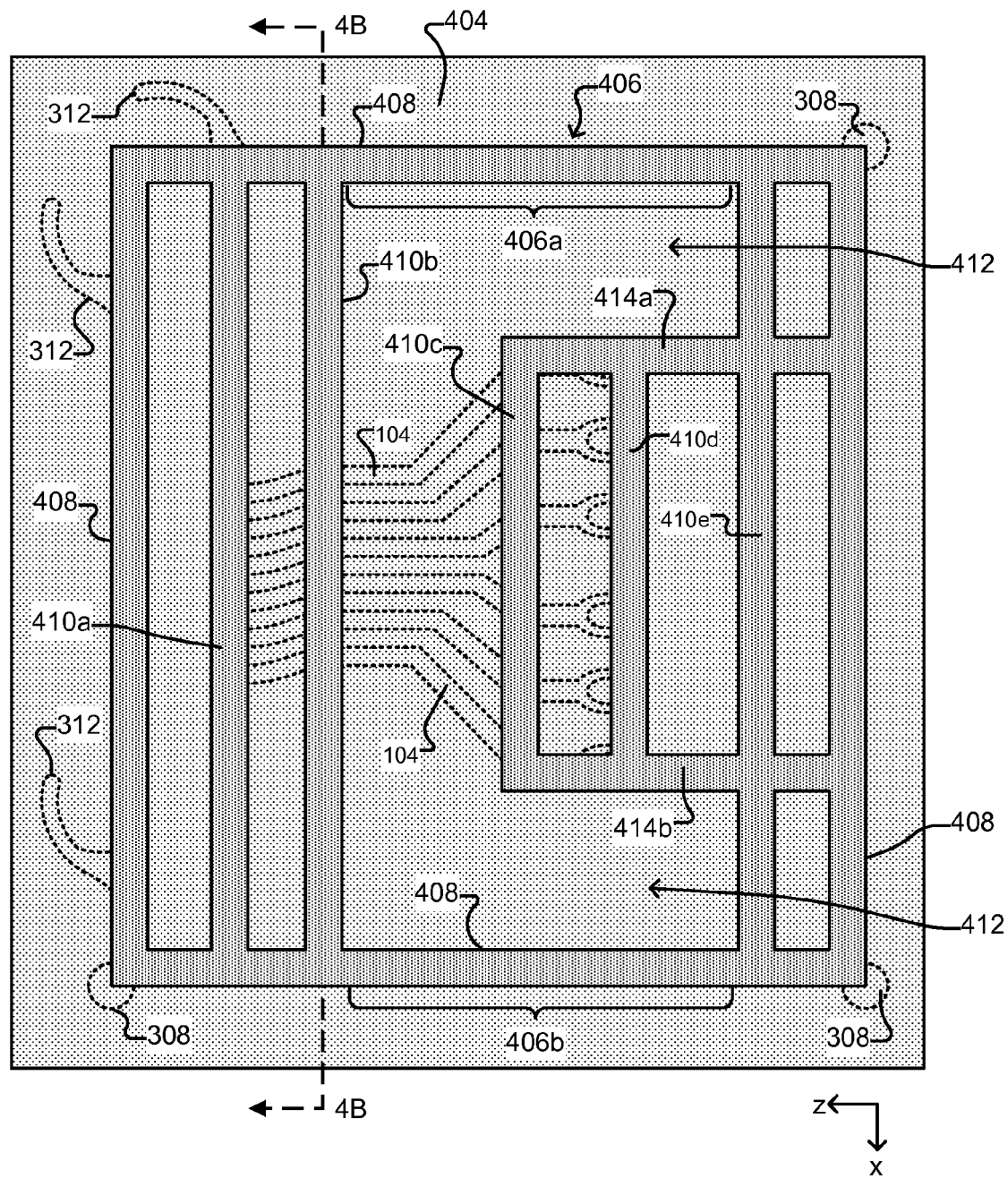

FIGS. 4A and 4B illustrate formation of a frame 408 on the row 114 of contact structures 104 of FIGS. 3A and 3B. The masking material 304 shown in FIGS. 3A and 3B can be removed from the substrate 302 and the contact structures 104. As shown in FIGS. 4A and 4B, a layer of masking material 404 can be deposited onto the substrate 302, the contact structures 104, the alignment features 308, and the handling features 312. In FIG. 4A, the masking material 404 can partially or totally cover the contact structures 104, the alignment features 308, and the handling features 312; they are thus illustrated in FIG. 4A as dashed lines. The masking material 404 can be patterned to have openings 406 in the desired pattern and shape of the frame 408 (including cross bars 410a, 410b, 410c, 410d, 410e, 414a, and 414b) to be formed on the row 114 of contact structures 104. Photolithographic techniques (such as are used in forming integrated circuits on semiconductor dies) can be used to make the openings 406.

As illustrated in FIG. 4A, there can be cross bars within the frame 408. FIG. 4A illustrates examples of such cross bars in the form of one or more vertical (i.e., generally parallel to the "x" axis of the Figure) cross bars 410a, 410b, 410c, 410d, and/or 410e and/or one or more horizontal (i.e., generally parallel to the "z" axis of the Figure) cross bars 414a and/or 414b. Although five vertical cross bars 410a, 410b, 410c, 410d, and 410e and two horizontal cross bars 414a and 414b are shown in FIG. 4A, there can be more or fewer than five vertical cross bars 410a, 410b, 410c, 410d, and 410e and/or there can be more or fewer than two horizontal cross bars 414a and 414b. Moreover, the pattern and locations of vertical cross bars 410a, 410b, 410c, 410d, and 410e and horizontal cross bars 414a and 414b can be different than illustrated in FIG. 4A. Also, such cross bars need not be arranged along vertical and/or horizontal axes but can be arranged in other directions and need not cross at right angles.

In some embodiments, the frame 408 and one or more of the cross bars can form an enclosed cavity 412, which can be in a shape that corresponds to a desired cross-sectional shape of the probe substrate 102 (see FIG. 1A) that, as will be seen, can be formed around the contact structures 104. As shown in FIG. 4A, the body portions 110 of the contact structures 104 can be disposed in the cavity 412. In the example shown in FIG. 4A, the cavity 412 can be formed by portions 406a and 406b of the frame, the vertical cross bars 410b and 410c, portions of the vertical cross bar 410e, and portions of the horizontal cross bars 414a and 414b. The shape of the cavity 412 shown in FIG. 4A is an example, and the shape of the cavity 412—and thus the shape of a cross-section of the probe substrate 102—can be different than the shape illustrated in FIG. 4A.

Once the openings 406 are formed in the masking material 404, the frame 408 and the cross bars 410a, 410b, 410c, 410d, 410e, 414a, and 414b can be formed by depositing material or materials (hereinafter "frame material" whether one material or more than one material) into the openings 406. The frame material can be any material suitable for the frame 406 and cross bars 410a, 410b, 410c, 410d, 410e, 414a, and 414b. For example, the frame material can be sufficiently rigid to keep the contact structures 104, alignment features 308, and handling features 312 in place during subsequent handling of the probe row structure 600. In some embodiments, the frame material can be a material or materials that can be etched, dissolved, or otherwise removed without appreciably etching, dissolving, or otherwise removing the contact structures 104. Examples of the frame material include nickel, cobalt, brass, bronze, iron or the like (including alloys (e.g., nickel-cobalt and nickel-iron) of the foregoing).

The frame material can be deposited into the openings 406 in any suitable manner. In some embodiments, the frame material can be deposited into the openings 406 by electroplating (in which case an electrically conductive seed layer (not shown) can be present on the substrate 302 and exposed by the openings 406). Alternatively, the frame material can be deposited into the openings 406 using other techniques such as electroless plating, chemical vapor deposition, ion plating, sputtering, and the like.

The frame 408 and cross bars 410a, 410b, 410c, 410d, 410e, 414a, and 414b can be formed to have a desired thickness $T_2$ (see FIG. 4B). In some embodiments, $T_2$ can be greater than $T_1$. The thickness $T_2$ can relate to the distance $D_1$ between rows 114 of contact structures 104 (see FIG. 1A). For example, the thickness $T_2$ can be selected such that the sum of the thickness $T_2$ and the thickness $T_3$ of a compressible shim 508 to be formed on the frame 408 (see FIGS. 5A and 5B) is greater than the distance $D_1$ by an amount by which the compressible shim 508 can be readily compressed such that the thickness $T_2$ and the thickness $T_3$ of the compressed shim 508 is equal to or approximately equal to $D_1$. For example, in an embodiment in which $D_1$ is desired to be about 50 microns, the thickness $T_2$ can be 38-42 microns, although in other embodiments, the thickness $T_2$ can be greater than 42 microns or less than 38 microns. Although not illustrated in the drawings, in some embodiments, the masking material 404 can be deposited with a thickness that is greater than thickness $T_2$, the frame material can be deposited into the openings 406 such that the frame material overfills the openings 406, and an upper portion of the masking material 404 and the frame material can be removed (e.g., by lapping, grinding, or the like) until the masking material 404 and the frame material have a thickness $T_2$ and a generally planar upper surface. Alternatively, the masking material 404 can be deposited onto the substrate 302 with a thickness $T_2$ and the frame material can be deposited in the openings 406 to a thickness $T_2$. As yet another alternative, the thickness of the masking material 404 can be greater than $T_2$ and the frame material can be deposited in the openings 406 to a thickness $T_2$.

FIGS. 5A and 5B illustrate formation of compressible shims 508 and/or 512 on the frame 408 and portions of the cross bars 410a, 410b, 410c, 410d, 410e, 414a, and 414b according to some embodiments of the invention. The masking material 404 shown in FIGS. 4A and 4B can be removed from the substrate 302, the contact structures 104, and the frame 408. As shown in FIGS. 5A and 5B, a layer of masking material 504 can be deposited onto the substrate 302, the contact structures 104, the alignment features 308 and handling features 312, and the frame 408. In FIG. 5A, the frame 408 and cross bars 410a, 410b, 410c, 410d, 410e, 414a, and 414b are shown covered by the masking material 504 and are thus illustrated in FIG. 5A in dashed lines. (The contact structures 104, alignment features 308, and handling features 312 are also covered by the masking material 504 but are not shown in FIG. 5A.) The masking material 504 can be patterned to have openings 506 and/or 510 in the desired pattern and shape of the compressible shims 508 and/or 512 to be formed on the frame 408 and cross bars 410a, 410b, 410c, 410d, 410e, 414a, and 414b. Photolithographic techniques (such as are used in forming integrated circuits on semiconductor dies) can be used to make the openings 506 and/or 510.

As shown in FIG. 5A, a compressible shim 508 can be in an enclosed shape and thus form an enclosed cavity 514. In some embodiments, the shape of the enclosed cavity 514 can be the same as or substantially the same as the enclosed cavity 412 discussed above with respect to FIG. 4A. For example, as shown in FIG. 5A, the compressible shim 508 can be formed on the portions of the frame 406 and cross bars 410b, 410c, and 410e that form the enclosed cavity 412. Generally as discussed above with respect to the enclosed cavity 412, the shape of the enclosed cavity 514 shown in FIG. 5A is an example only, and the enclosed cavity 514 can have other shapes (e.g., simple shapes like rectangular, square, and the like or complex shapes). As will be seen in FIGS. 7A, 7B, and 7C, compressible shims 512 can provide increased stability in a stack of probe row structures 600. Although two compressible shims 512 are shown in FIG. 5A, there can be more or fewer than two such compressible shims 512. Moreover, the shapes and locations of the compressible shims 512 can be different than are shown in the example of FIG. 5A.

Once the openings 506 and 510 are formed in the masking material 504, the compressible shims 508 and 512 can be formed by depositing material or materials (hereinafter "shim material" whether one material or more than one material) into the openings 508 and 512. The shim material can be any material suitable for the shims 508 and 512. For example, the shim material can be compressible when subjected to forces that are less than would break or appreciably damage the frame 408. Examples of the shim material include copper, gold, silver, and the like (including alloys of the foregoing). The shim material can be deposited into the openings 506 and 510 in any suitable manner. In some embodiments, the shim material can be deposited into the openings 506 and 510 by electroplating (in which case an electrically conductive seed layer (not shown) can be present on the substrate 302 and exposed by the openings 506 and 510). Alternatively, the contact material can be deposited into the openings 506 and 510 using other techniques such as electroless plating, chemical vapor deposition, ion plating, sputtering, and the like.

In some embodiments, however, the shims 508 and 512 need not be formed in openings 506 and 510 in a masking material 504. In such embodiments, the masking material 504 need not be deposited. Instead, shim material can be deposited at least on portions of the frame 408 where shims 508 and 512 are desired. For example, the shim material can be deposited as a blanket layer on all, most of, or part of the masking material 404 and frame 408 shown in FIGS. 4A and 4B. The shim material can then be selectively removed to leave only the shims 508 and 512. Patternable organic materials such as photoresist are examples of suitable shim material. Dry photoresist films such as a photoimageable polyimide are also examples of suitable shim material.

The compressible shims 508 and 512 can be formed to have a desired thickness $T_3$. For example, in some embodiments, the thickness $T_3$ can be 18-22 microns, although in other embodiments, the thickness $T_3$ can be greater than 22 microns or less than 18 microns. Although not illustrated in the drawings, in some embodiments, the masking material 504 can be deposited with a thickness that is greater than the sum of the thicknesses $T_2$ and $T_3$, the shim material can be deposited into the openings 506 and 510 such that the shim material overfills the openings 506 and 510, and an upper portion of the masking material 504 and the shim material can be removed (e.g., by lapping, grinding, or the like) until the masking material 504 has a thickness that is the sum of the thicknesses $T_2$ and $T_3$ and the shims 508 and 512 thus have a thickness $T_3$. Alternatively, the masking material 504 can be deposited onto the substrate 302 with a thickness that is the sum of the thicknesses $T_2$ and $T_3$ and the shim material can be deposited in the openings 506 and 510 to a thickness $T_3$.

As shown in FIGS. 6A and 6B, the masking material 504 can be removed from the substrate 302, and the row 114 of contact structures 104, the alignment features 308, the handling features 312, and the frame 408 (with cross bars 410a, 410b, 410c, 410d, 410e, 414a, and 414b) can be removed from the substrate 302, which can be done using any suitable method. For example, the row 114 of contact structures 104, the alignment features 308, the handling features 312, and the frame 408 can be removed from the substrate 302 by etching away a release layer (not shown) on the substrate 302 between the substrate 302, on one hand, and the row 114 of contact structures 104, the alignment features 308, the handling features 312, and the frame 408, on the other hand. Alternatively, other methods such as thermal shock, application of a force, and the like can be utilized.

The result can be a probe row structure 600 as illustrated in FIGS. 6A and 6B comprising the row 114 of contact structures 104, the alignment features 308, and the handling features 312 coupled to the frame 408 (with cross bars 410a, 410b, 410c, 410d, 410e, 414a, and 414b) on which are disposed the compressible shims 508 and 512. A plurality of such probe row structures 600 can be made as generally discussed above. Alternatively, such probe row structures 600 can be made or otherwise obtained in other ways at 202 of the process 200 of FIG. 2. For example, the probe row structures 600 can simply be obtained from a third party.

Figure 7A:
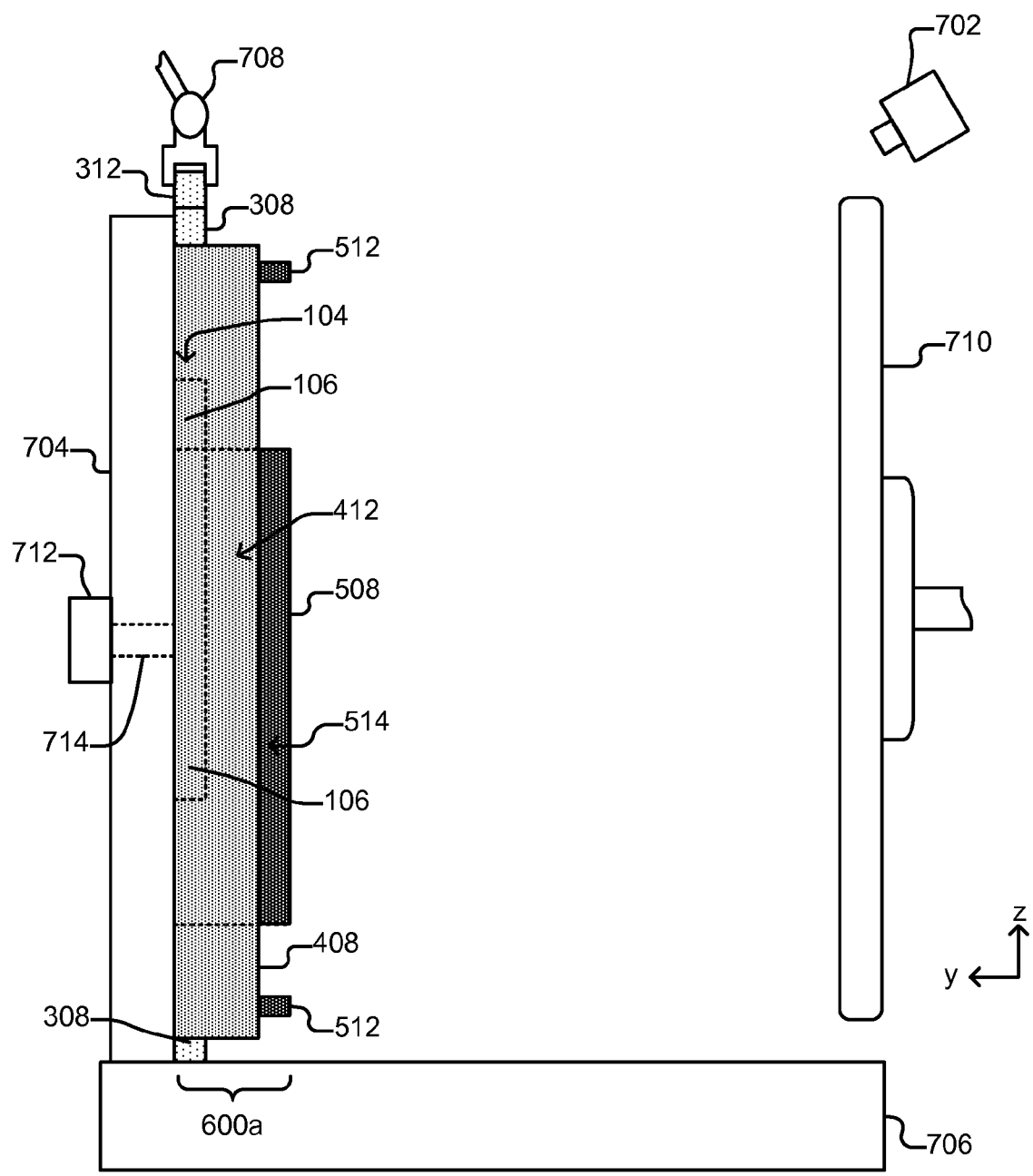
FIGS. 7A, 7B, and 7C illustrate an example in which a plurality of the probe row structures can be disposed in a stack and compressed according to some embodiments of the invention.
Figure 7B:
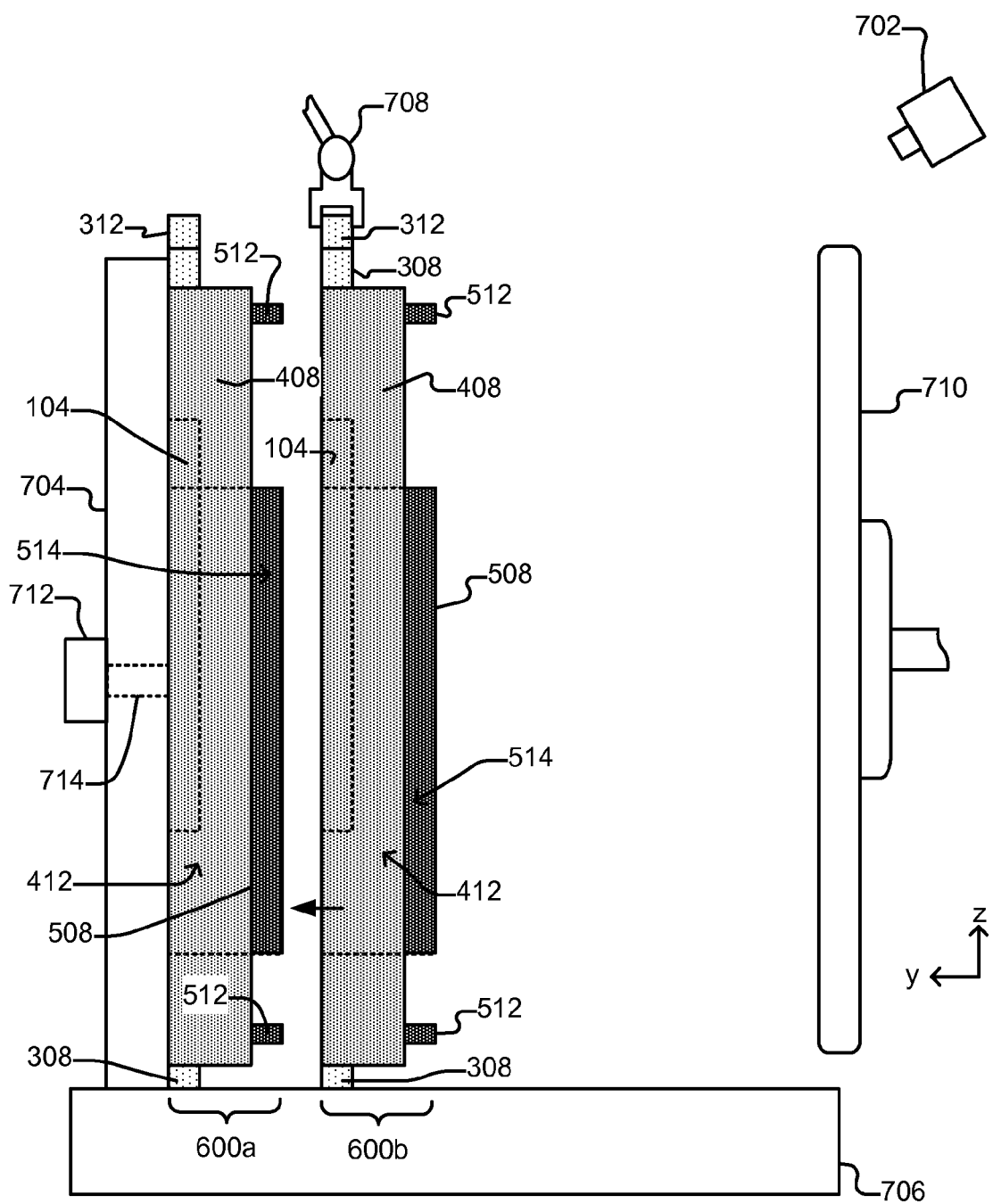
Figure 7C:
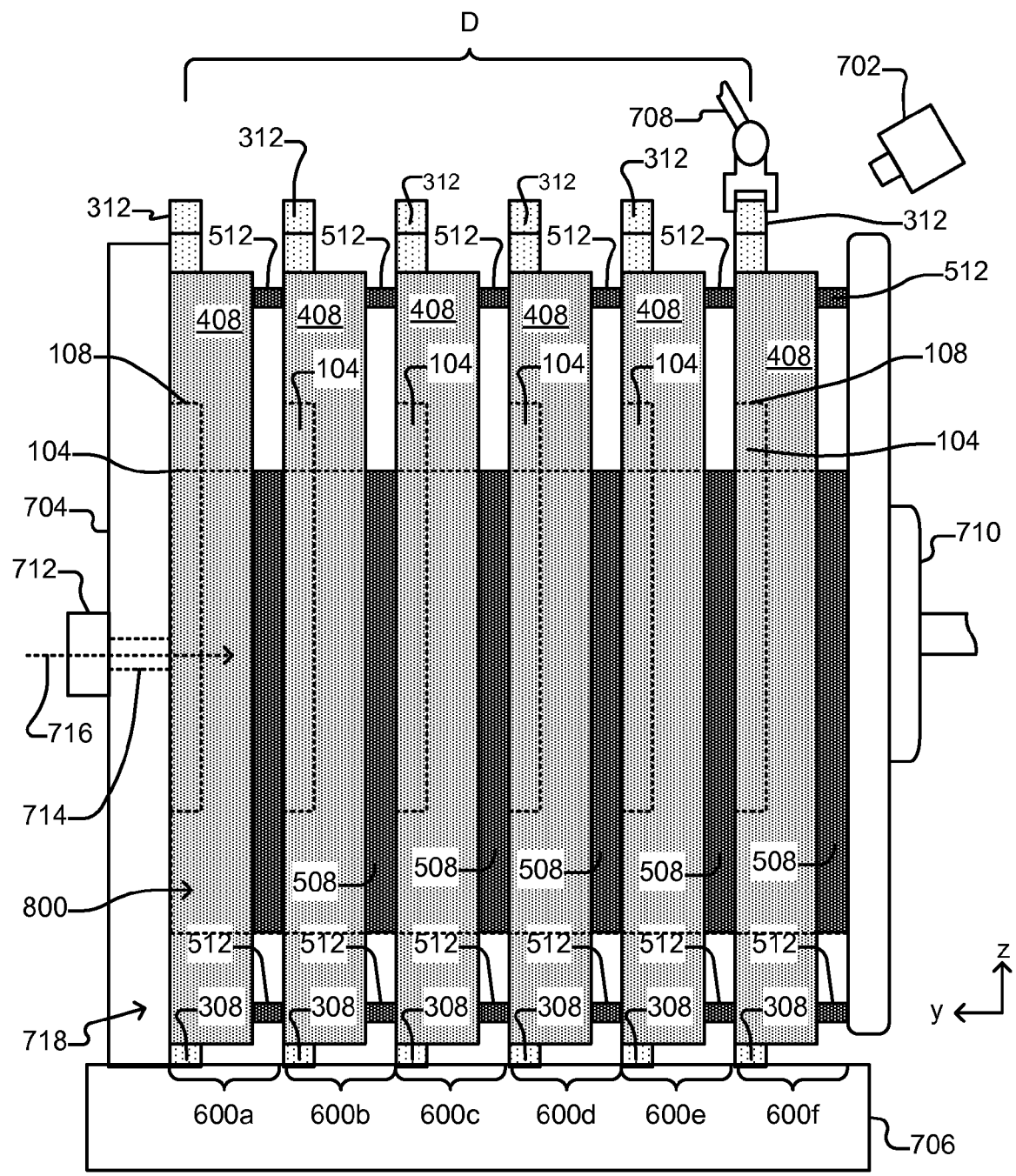

Referring again to FIG. 2, after the probe row structures 600 are obtained at 202 of the process 200, a plurality of probe row structures 600 can be placed in a stack at 204 of the process 200. FIGS. 7A, 7B, and 7C illustrate an example in which a plurality of probe row structures 600 can be placed in a stack according to some embodiments of the invention.

As shown in FIGS. 7A, 7B, and 7C, a plurality of probe row structures 600a, 600b, 600c, 600d, 600e, and 600f can be placed one on another in a stack 718. Although there are six probe row structures 600a, 600b, 600c, 600d, 600e, and 600f in the stack 718 shown in FIG. 7C, there can be more or fewer probe row structures 600a, 600b, 600c, 600d, 600e, and 600f in the stack 718. Also, one or more of the outer probe row structures 600a and/or 600f in the stack 718 need not include contact structures 104 but can be included in the stack 718 to stabilize the stack 718.

As shown in FIG. 7A, a first of the probe row structures 600a can be grasped and positioned by a handling mechanism 708. For example, the handling mechanism 708 can be a pick and place mechanism such as those used to handle semiconductor dies. As another example, the handling mechanism 708 can be a simple grasping tool used by a human operator to manually grasp and position a probe row structure 600. The handling mechanism 708 can grasp the first probe row structure 600a by one or more of the handling features 312. A sensing device 702 (e.g., a camera) can be utilized to monitor the alignment features 308, which can be used to position the first probe row structure 600a in a desired position. For example, as shown in FIG. 7A, the first probe row structure 600a can be placed on a rigid support structure 706 and against a rigid structure 704, which as shown, can include an inlet port 712 with a passage 714 to the cavity 412 of the probe row structure 600.

As shown in FIG. 7B, the handling mechanism 708 can grasp a second probe row structure 600b and position the second probe row structure 600b on the rigid support structure 706 adjacent the first probe row structure 600a. As shown in FIG. 7C, additional probe row structures 600c, 600d, 600e, and 600f can be grasped by the handling mechanism 708 and positioned on the rigid support structure 706 in a stack 718. (As mentioned above, there can be more or fewer than six probe row structures 600c, 600d, 600e, and 600f in the stack 718.) Utilizing the sensing device 702 and the alignment features 308 of each of the probe row structures 600a, 600b, 600c, 600d, 600e, and 600f, the probe row structures 600a, 600b, 600c, 600d, 600e, and 600f can be positioned with respect to each other in the stack 718 such that the rows 114 of contact structures 104 are positioned as desired (e.g., so that the contact ends 108 of the contact structures 104) are in a desired pattern. As shown in FIG. 7C, the cavities 412 and 514 of each of the probe row structures 600 can align and, as will be seen, form a mold in which the probe substrate 102 (see FIG. 1A) can be formed. It is noted that one or more additional rigid structures (e.g., like rigid structure 704) and/or additional rigid support structures (e.g., like rigid support structure 706) can be provided to support and/or align the probe row structures 600. For example, such additional rigid structures and/or rigid support structures can be positioned and oriented approximately 90 degrees with respect to the rigid structure 704 and/or the rigid support structure 706. The handling features 312 can also be used to align the probe row frame structures 600. For example, the handling features 312, which as mentioned, can have spring-like properties, can be pressed against the additional rigid support structures and/or additional rigid structures.

As also shown in FIG. 7C, a compressing mechanism 710 can be move against an outer probe row structures 600f in the stack 718. The stack 718 can thus be compressed between the rigid structure 704 and the compressing mechanism 710. As discussed above, the compressible shims 508 and 512 of each probe row structures 600a, 600b, 600c, 600d, 600e, and 600f are compressible but the frames 408 are not appreciably compressible. As the compressible shims 508 and 512 of each probe row structures 600a, 600b, 600c, 600d, 600e, and 600f are compressed, a distance D between outer probe row structures 600a and 600f in the stack 718 decreases. For example, the distance D can be between features (e.g., contact ends 108 of the contact structures 104) of the outer probe row structures 600a and 600e. The distance D can be monitored by sensing device 702, and the stack 718 can be compressed until the distance D is a desired distance. The desired distance D can be a distance that results in the average distance between the contact ends 108 of contact structures 104 of adjacent probe row structures 600a, 600b, 600c, 600d, 600e, and 600f in the stack 718 being the distance $D_1$ in FIG. 1A after the compressible shims 508 and 512 equalize or approximately equalize to a reduced energy state or the like.

Referring again to the process 200 of FIG. 2, at 206, the probe substrate 102 (see FIGS. 1A and 1B) can be formed around the contact structures 104 in the stack 718. FIG. 8 illustrates an example.

As mentioned, the cavities 412 and 514 of each probe row structures 600a, 600b, 600c, 600d, 600e, and 600f in the stack 718 shown in FIG. 7C can align and, with the rigid structure 704 and the compressing mechanism 710, form a mold 800 as illustrated in FIG. 8. The probe row structures 600a, 600b, 600c, 600d, 600e, and 600f can be aligned in the stack 718 by one or more of the rigid structure 704, the rigid support structure 706, the compressing mechanism 710, and any other such structure or structures disposed perpendicular to one of the foregoing. In some embodiments, one or more handling features 312 of a probe row structure 600a, 600b, 600c, 600d, 600e, and/or 600f can be grasped by the handling mechanism 708, which can then press alignment features 308 of the probe row structure against two of the support structure 706, rigid support 704, or similar such structure that are generally perpendicular with each other. A handling feature 312 can be springy so that it rather than the frame 408 of the probe row structure 600a, 600b, 600c, 600d, 600e, and/or 600f gives or bends as the alignment features 308 are pressed against the two perpendicular support structure 706, rigid support 704, or similar such structure.

FIG. 8 shows a portion of each of the rigid structure 704 and the compressing mechanism 710, which form ends of the mold 800, and the cavities 412 and 514 of each of the probe row structures 600a, 600b, 600c, 600d, 600e, and 600f, which form the body of the mold 800. A moldable material 716 can be introduced into the mold 800 through an inlet port 712 and passage 714 through the rigid structure 704. Although not shown, the compressing mechanism 710 can include an outlet port (not shown) that allows air to escape from the mold 800 as the moldable material 716 is introduced into the mold 800. The moldable material 716 can be hardened (e.g., cured) to form a probe substrate 102 (see FIGS. 1A and 1B) around the probe structures 104. The moldable material 716 can be any material that is sufficiently viscous to be introduced into the mold 800 and then hardened. Examples of moldable material 716 include polymers with a glass transition temperature greater than 100 degrees Celsius (e.g., liquid crystalline polymers, polyether ether ketone, and polyethylene naphthalate). In some embodiments, the moldable material can be hardened (e.g., cured) by exposure to radiation (e.g., ultraviolet light) and/or heat.

Referring again to the process 200 of FIG. 2, at 208, after the moldable material 716 hardens to form the probe substrate 102 (see FIGS. 1A and 1B), the frame 408 (and vertical cross bars 410a, 410b, 410c, 410d, 410e, 414a, and 414b), and shims 508 and 512 of each of the probe row structures 600a, 600b, 600c, 600d, 600e, and 600f can be removed, leaving substantially only the contact structures 104 and the probe substrate 102. The frame 408 (and vertical cross bars 410a, 410b, 410c, 410d, 410e, 414a, and 414b) and shims 508 and 512 of each of the probe row structures 600a, 600b, 600c, 600d, 600e, and 600f can be removed in any suitable manner. For example, the frame 408 (and vertical cross bars 410a, 410b, 410c, 410d, 410e, 414a, and 414b) and shims 508 and 512 of each of the probe row structures 600a, 600b, 600c, 600d, 600e, and 600f can be etched away or dissolved using a solvent (e.g., a cyanide, acid, or alkaline based solvent) that does not appreciably etch or dissolve the contact structures 104 or the substrate 102.

In the example shown in FIG. 3A through FIG. 6B, there can be a space transformation in a row 114 of contact structures 104 from the contact ends 108 to the connector portions 112. That is, a distance $D_2$ between the contact ends 108 can be different than a distance $D_3$ between the connector portions 112. For example, as shown in FIGS. 1B and 3A, the distance $D_2$ between the contact ends 108 can be smaller than the distance $D_3$ between the connector portions 112. Also as can be seen in FIGS. 1B and 3A, the space transformation can be in a direction generally parallel with the row 114, which direction is along the "x" axis in FIGS. 1B and 3A. (A direction along the "x" axis can be termed a first direction.) There can thus be a space transformation in a direction of the "x" axis between the contact ends 108 and the connector portions 112 of the contact structures 104 in the group 126 of contact structures 104 in FIG. 1A. As should be apparent from FIGS. 7A, 7B, and 7C, because there is generally a uniform distance at the contact ends 108 and the connector ends 112 between the rows 114 of contact structures 104 on adjacent probe row structures 600, there need not be a similar space transformation of the group of probes 126 along the "y" axis. (A direction along the "y" axis can be termed a second direction that is generally perpendicular to the first direction.) FIGS. 9, 10A, 10B, and 10C illustrate an example in which a space transformation can also be provided along the "y" axis.

Figure 9:
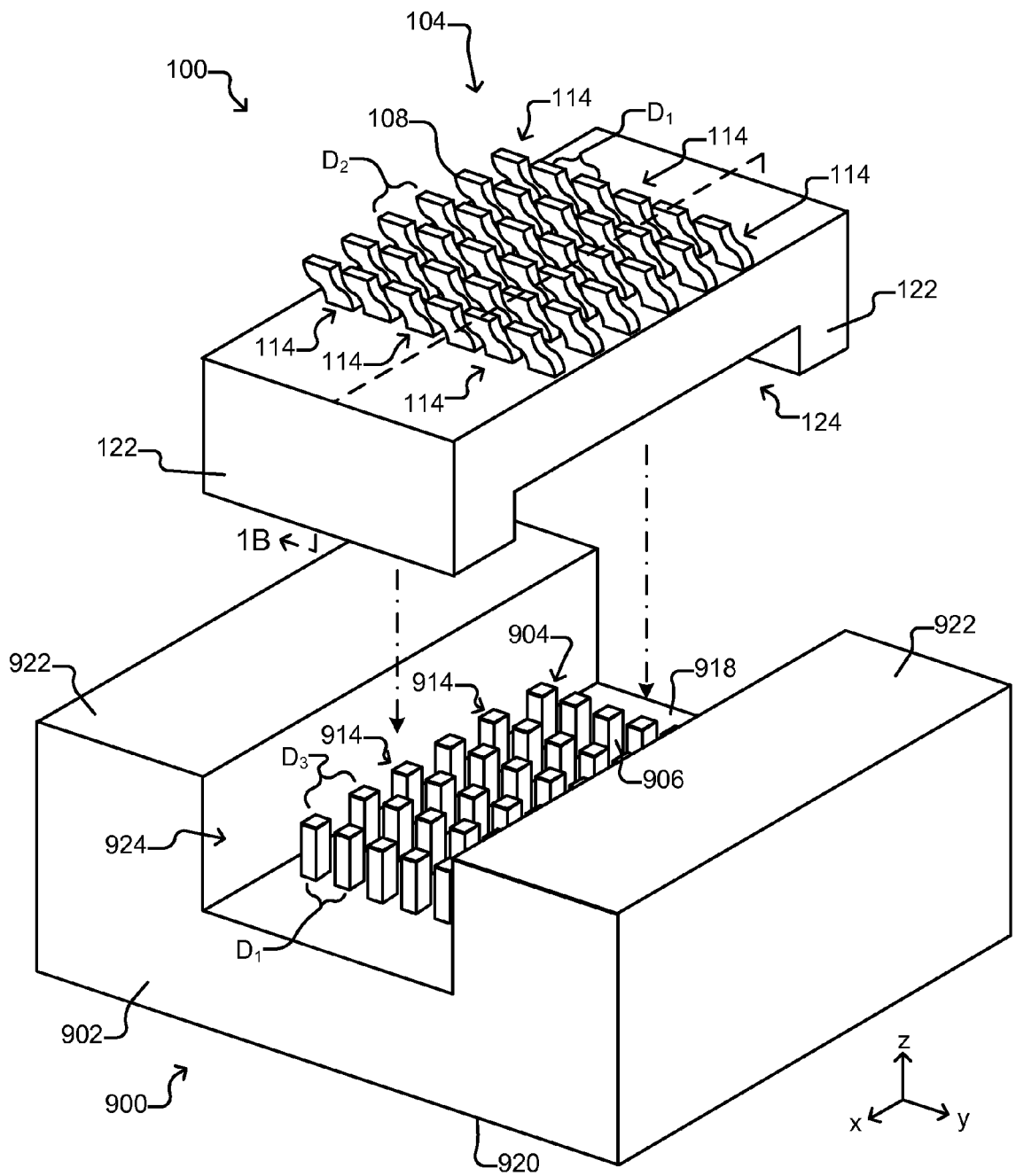
FIG. 9 shows the probe head of FIGS. 1A and 1B and a corresponding space transformer according to some embodiments of the invention.

FIG. 9 shows the probe head 100 of FIGS. 1A and 1B and a space transformer 900 with conductors 904 having coupling portions 906 that can mate or otherwise make electrical contact with the connector portions 112 of the contact structures 104 of the probe head 100.

Figure 10A:
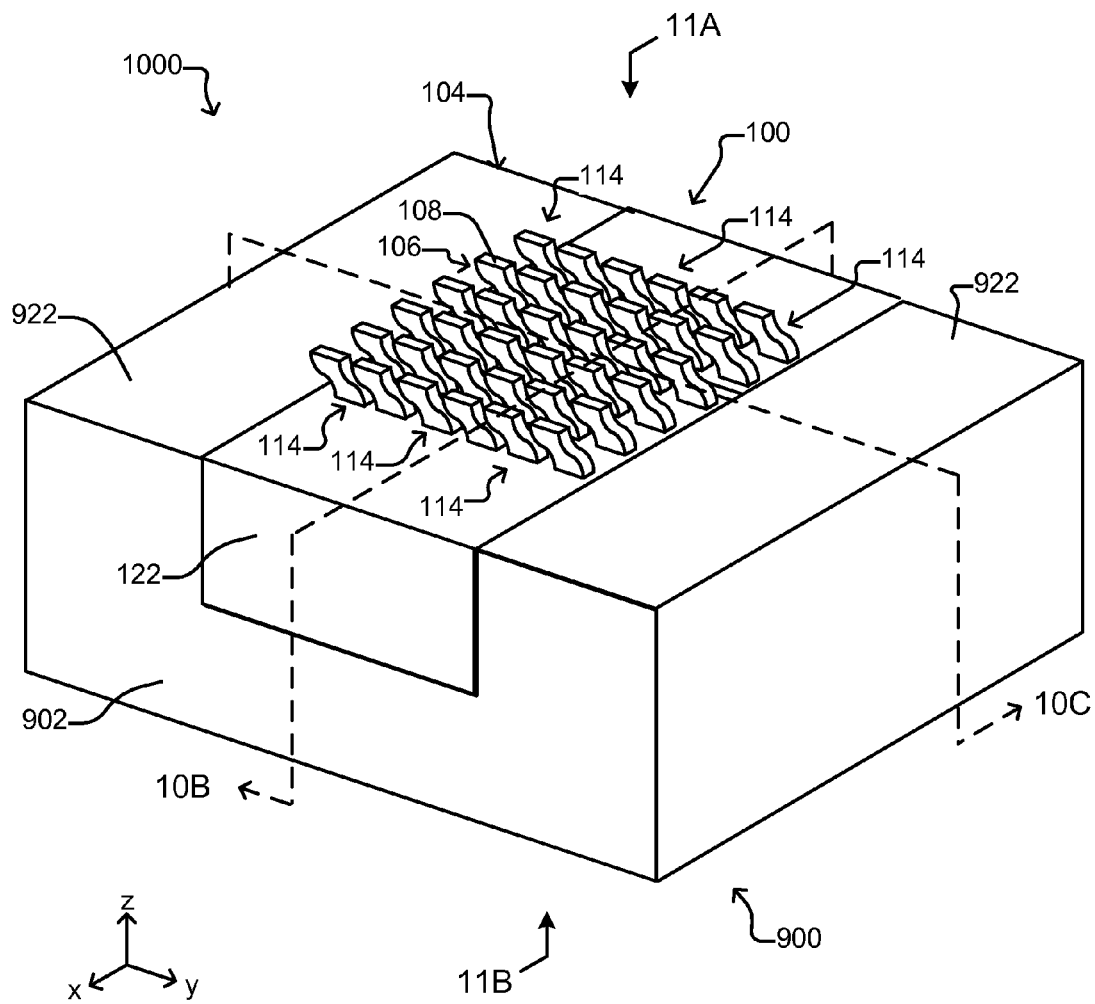
FIG. 10A shows a perspective view and FIGS. 10B and 10C show different side, cross-sectional views of a composite probe head comprising the probe head and space transformer coupled together according to some embodiments of the invention.
Figure 10B:
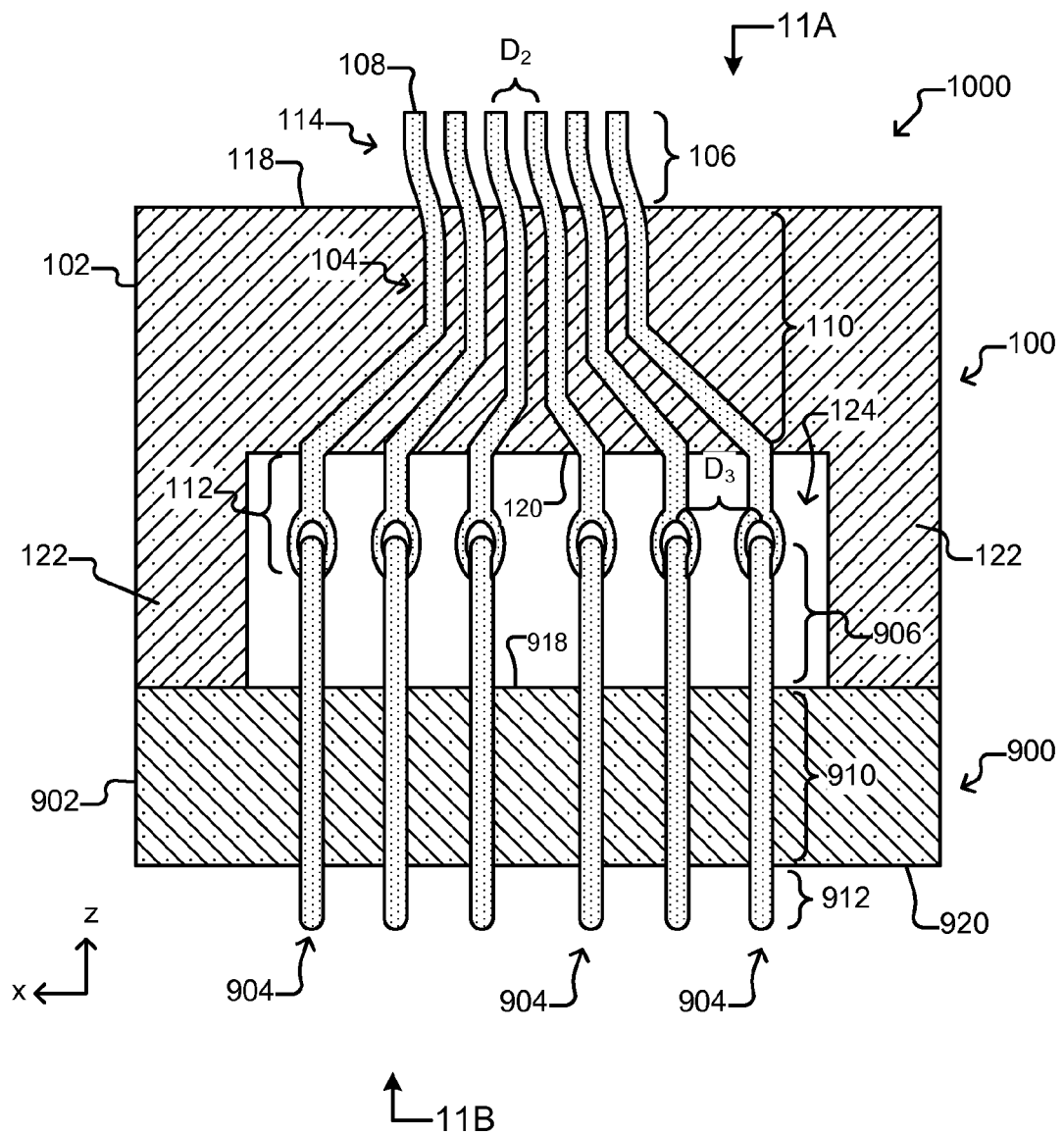
Figure 10C:
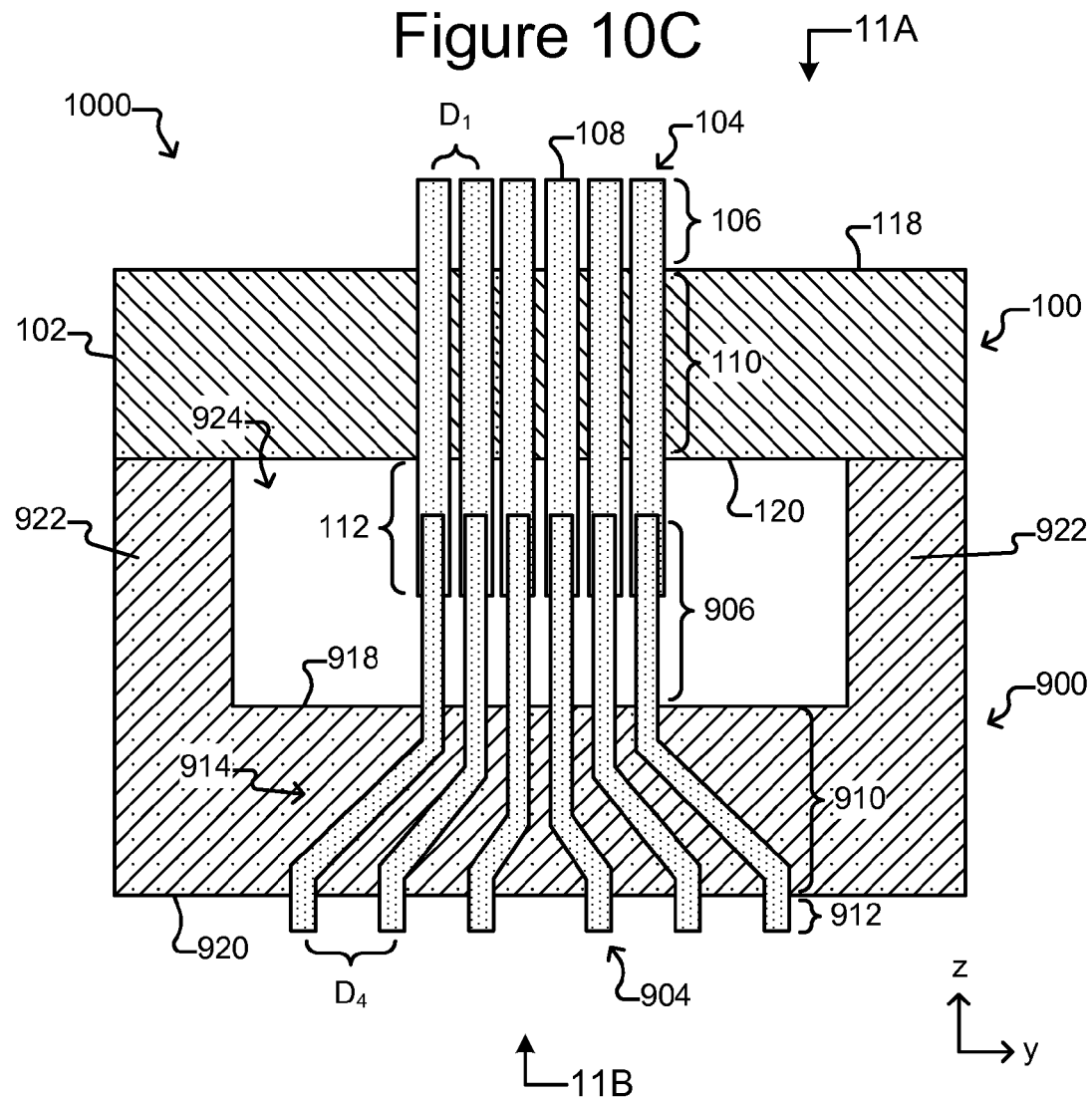

In some embodiments, as shown in FIGS. 10A, 10B, and 10C, the space transformer 900 can comprise conductors 904 embedded in a substrate 902. As best seen in FIG. 10B, the conductors 904 can comprise coupling portions 906 each of which can mate (e.g., contact and make an electrical connection with) a connector portion 112 of one of the contact structures 104 embedded in the probe substrate 102. As can also be seen in FIG. 10B, a distance $D_3$ along the "x" axis between the coupling portions 906 can be generally the same as the distance $D_3$ between the connector portions 112 of the contact structures 104. As also shown in FIG. 10B, the distance between contact portions 912 of the conductors 904 in the "x" direction can be generally the same distance $D_3$. There thus need not be a space transformation along the "x" axis between the coupling portions 906 and the contact portions 912 of the conductors 904. As best seen in FIG. 10C, however, there can be such a space transformation along the "y" axis.

As can be seen in FIG. 10C, each conductor 904 can comprise a coupling portion 906, a body portion 910, and a contact portion 912. As shown in FIG. 10C, each body portion 910 can flare out such that the contact portions 912 of at least some of the conductors 904 are spaced apart a distance $D_4$ in a direction (e.g., a second direction that is generally perpendicular to the above-discussed first direction along the "x" axis) that is greater than a distance $D_4$ also in along the "y" axis between coupling portions 906 of at least some of the conductors 904. This can provide a space transformation of the conductors 904 along the "y" axis.

Each conductor 904 can be integrally formed and can thus be a single, integral structure. As illustrated in FIG. 10C, the coupling portions 906 can extend from a first surface 918 of the substrate 902, and the contact portions 912 can extend from a second surface 920 of the substrate 902 that can be opposite the first surface 918. As also illustrated, the body portions 910 can be embedded in the substrate 902. As shown, the substrate 902 can include extensions 922 that extend from the first surface 918. In such an embodiment, the first surface 918 can be in a space 924 between the extensions 922. In some embodiments, however, the substrate 902 does not include extensions 922 or space 924. Regardless, the substrate 902 can have properties that are generally similar to the probe substrate 902. For example the substrate 902 can be rigid and thus comprise hard and/or rigid materials. Examples of materials suitable for the substrate 902 include those identified above as examples of materials suitable for probe substrate 102.

The illustration of the space transformer 900 in FIG. 9 is an example only, and many variations are possible. For example, the shapes of the conductors 904 can be different than shown in FIG. 9. For example, the coupling portions 906 can be shaped as clips configured to couple with the connector portions 112. As another example, the number and pattern of conductors 904 in a row 914 can be different than shown in FIG. 9. As yet another example, the substrate 902 need not include extensions 922. As still another example, the substrate 902 need not be box or rectangular shaped but can be other shapes (e.g., a square shape or a cylindrical shape).

Figure 11A:
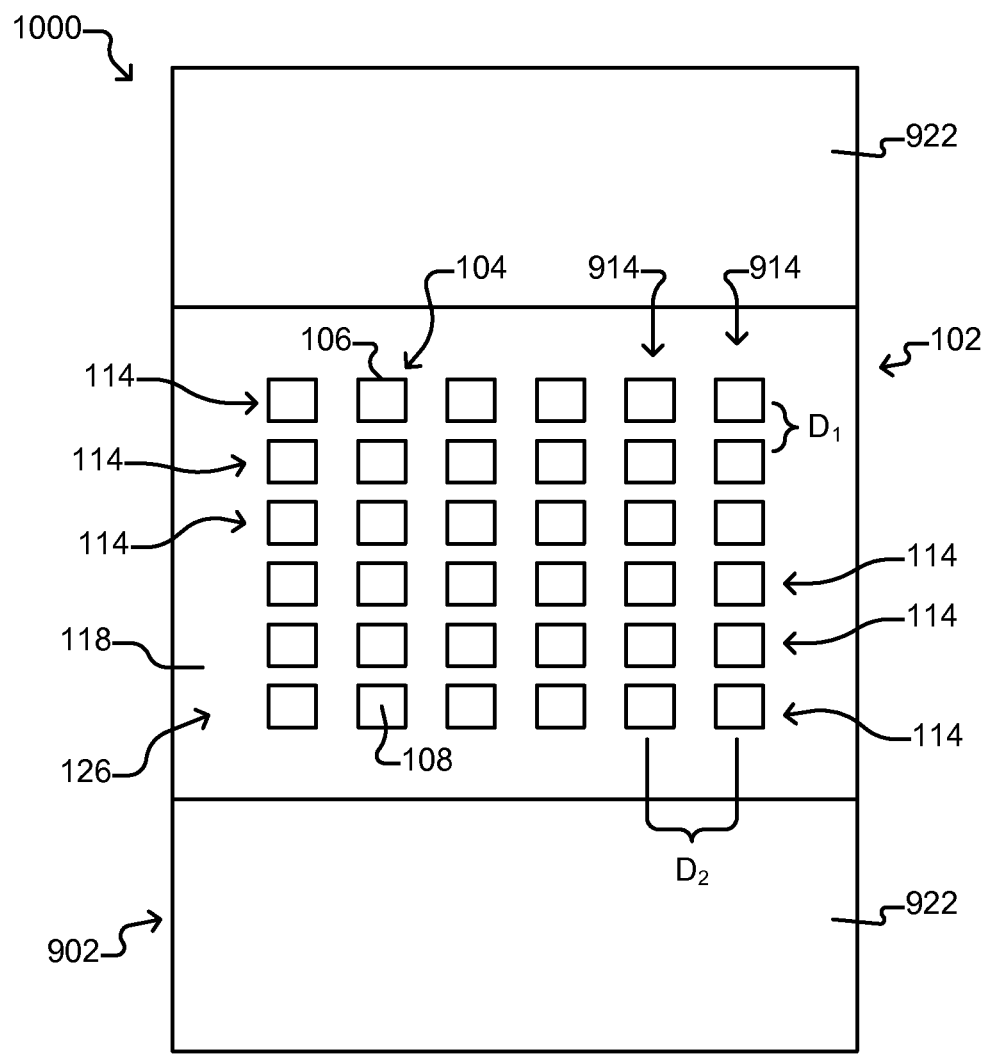
FIG. 11A shows a top view and FIG. 11B shows a bottom view of the composite probe head of FIGS. 10A, 10B, and 10C according to some embodiments of the invention.
Figure 11B:
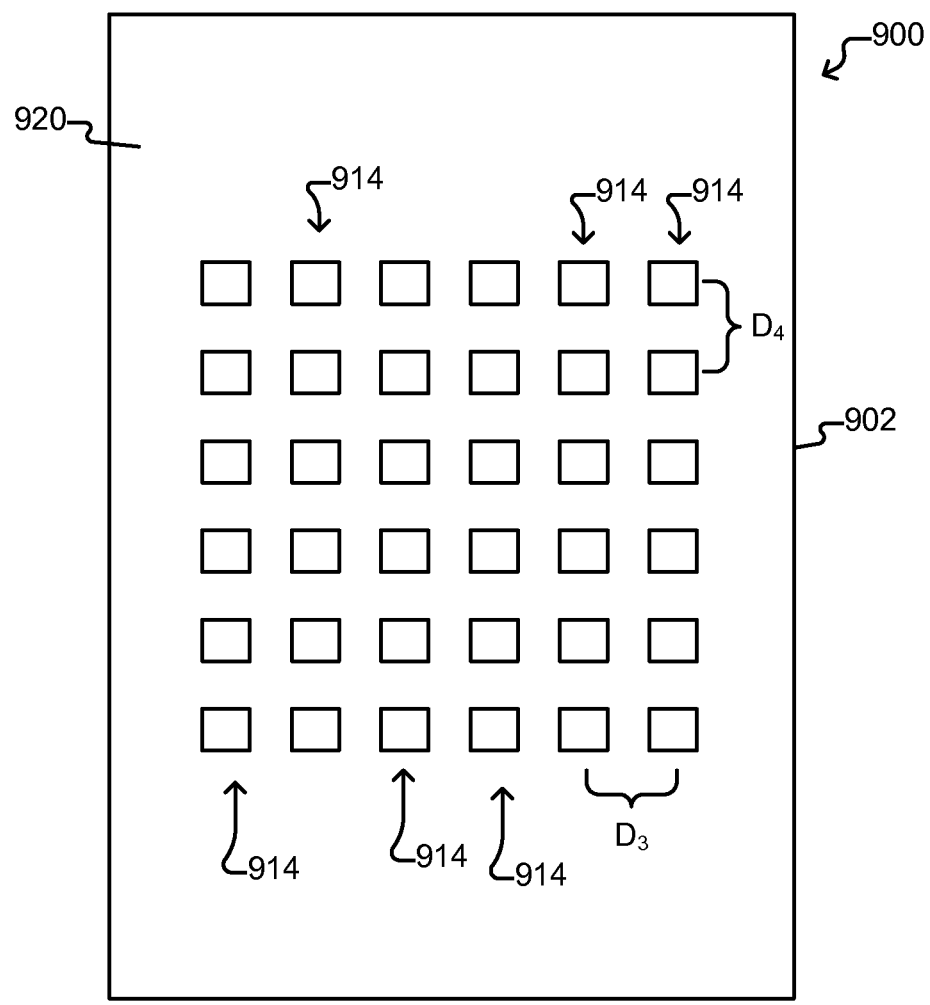

A probe head assembly 1000 comprising the probe head 100 of FIGS. 1A and 1B coupled to the space transformer 900 can provide a space transformation in both a first direction (e.g., along the "x" axis) and a second direction (e.g., along the "y" axis) that is generally perpendicular to the first direction between contact ends 108 of the probe portions 106 and the contact portions 912. The probe substrate 102 or the probe head 100 and the substrate 902 of the space transformer 900 can be coupled to each other in any suitable manner including with an adhesive or fastening devices such as clamps, screws, bolts, and the like. Alternatively or in addition, the connector portions 112 and the coupling portions 906 can comprise clips or other types of fasteners that can be clipped or fastened to each other. FIG. 11A (which shows a top view of the probe head assembly 1000) and FIG. 11B (which shows a bottom view of the probe head assembly 1000) illustrate an example. As can be seen in FIG. 11A, there can be a distance $D_1$ along the "x" axis and a distance $D_2$ along the "y" axis between adjacent contact ends 108 of the probe portions 106 extending from the first surface 118 of the probe substrate 102. As can be seen in FIG. 11B, however, the distance $D_4$ along the "x" axis between the contact portions 912 extending from the surface 920 of the substrate 902 can be greater than the distance $D_1$, which represents a space transformation along the "x" axis (in a first direction) between the contact ends 108 and the contact portions 912. As can also be seen in FIG. 11B, the distance $D_3$ along the "y" axis between adjacent contact portions 912 extending from the surface 920 of the substrate 902 can be greater than the distance $D_2$, which represents a space transformation along the "y" axis (in a second direction) between the contact ends 108 and the contact portions 912.

The space transformer 900 can be made in generally the same way as the probe head 100. For example, a plurality of conductor row structures (not shown) comprising a row 914 of conductors 904 on a frame (not shown but can be like frame 408) with a compressible shims (not shown but can be like shims 508 and 512) can be formed generally in the same way as the probe row structures 600 are made in FIG. 3A through FIG. 6B. Such conductor row structures (not shown) can then be placed in a stack (not shown) generally in the same way that probe row structures 600 are placed into stack 718 in FIGS. 7A, 7B, and 7C. The substrate 902 can be formed around the conductors 904 generally in the same manner that probe substrate 102 is made around the contact structures 904 as illustrated in FIG. 8. The frame (not shown) and the shims (not shown) can then be removed generally in accordance with the discussion of 208 in the process 200 of FIG. 2 above, leaving the conductors 904 embedded in the substrate 902.

The examples illustrated in FIGS. 1A through 11B are not limiting, and many variations are possible.

For example, although the contact ends 108 of the probe portions 106 are illustrated in FIG. 1A as being disposed in a regular pattern of rows 114 and columns that are perpendicular to the rows 114, the contact ends 108 can be disposed in other patterns. FIGS. 12 and 13 illustrate two examples of such alternative patterns.

In FIG. 12, the contact ends 108 of the contact structures 104 are disposed in an alternative pattern 1200. In FIG. 12, alternating rows 1214a of the contact structures 104 can have a first number (e.g., six are shown in FIG. 12 but there can be more or fewer) of contact structures 104 and rows 1214b can have a different, greater number (e.g., seven are shown in FIG. 12 but there can be more or fewer). In the pattern 1200, contact ends 108 in the rows 1214a can be interleaved with respect to the contact ends 108 in the rows 1214b as shown in FIG. 12. The rows 1214a and 1214b can replace the rows 114 in FIG. 1A.

In FIG. 13, the contact ends 108 of the contact structures 104 are disposed in yet another alternative pattern 1300. In FIG. 13, outer rows 1314a of the contact structures 104 can have a line of contact structures 104 (e.g., six are shown in FIG. 12 but there can be more or fewer) and inner rows 1314b can have contact structures 104 only in end positions as shown in FIG. 13. The outer rows 1314a and the inner rows 1314b (which can replace the rows 114 in FIG. 1A) can be arranged such that the contact ends 108 are arranged in a pattern 1300 corresponding to a perimeter of a square or rectangle as shown in FIG. 13.

FIG. 14 illustrates a process 1400 that represents an example of an alternative to the process 200 for making the probe head 100 of FIGS. 1A and 1B. Process 1400 can also be used to make the space transformer 900 of FIG. 9. For ease of illustration and discussion, however, the process 1400 is illustrated in FIGS. 15A to 17 and discuss below with regard to making the probe head 100 of FIGS. 1A and 1B.

As shown in FIG. 14, a plurality of probe row frame structures can be obtained at 1402. In some embodiments, the frame structures can be like the probe row structures 600 obtained at 202 of the process 200 of FIG. 2 and discussed above but without the compressible shims 508 and 512. Examples of such probe row frame structures are illustrated as 1500a, 1500b, 1500c, 1500d, 1500e, and 1500f in FIGS. 15A, 15B, 16, and 17. Thus, in some embodiments, the probe row frame structures (e.g., 1500a, 1500b, 1500c, 1500d, 1500e, and 1500f) can be obtained as illustrated in FIGS. 3A through 6B and discussed above with respect to those figures but omitting depositing the masking material 504 and forming the shims 508 and 510. Alternatively, the probe row frame structures 1500a, 1500b, 1500c, 1500d, 1500e, and 1500f can be obtained at 1402 of FIG. 14 in other ways including obtaining the probe row frame structures from a third party.

Figure 15A:
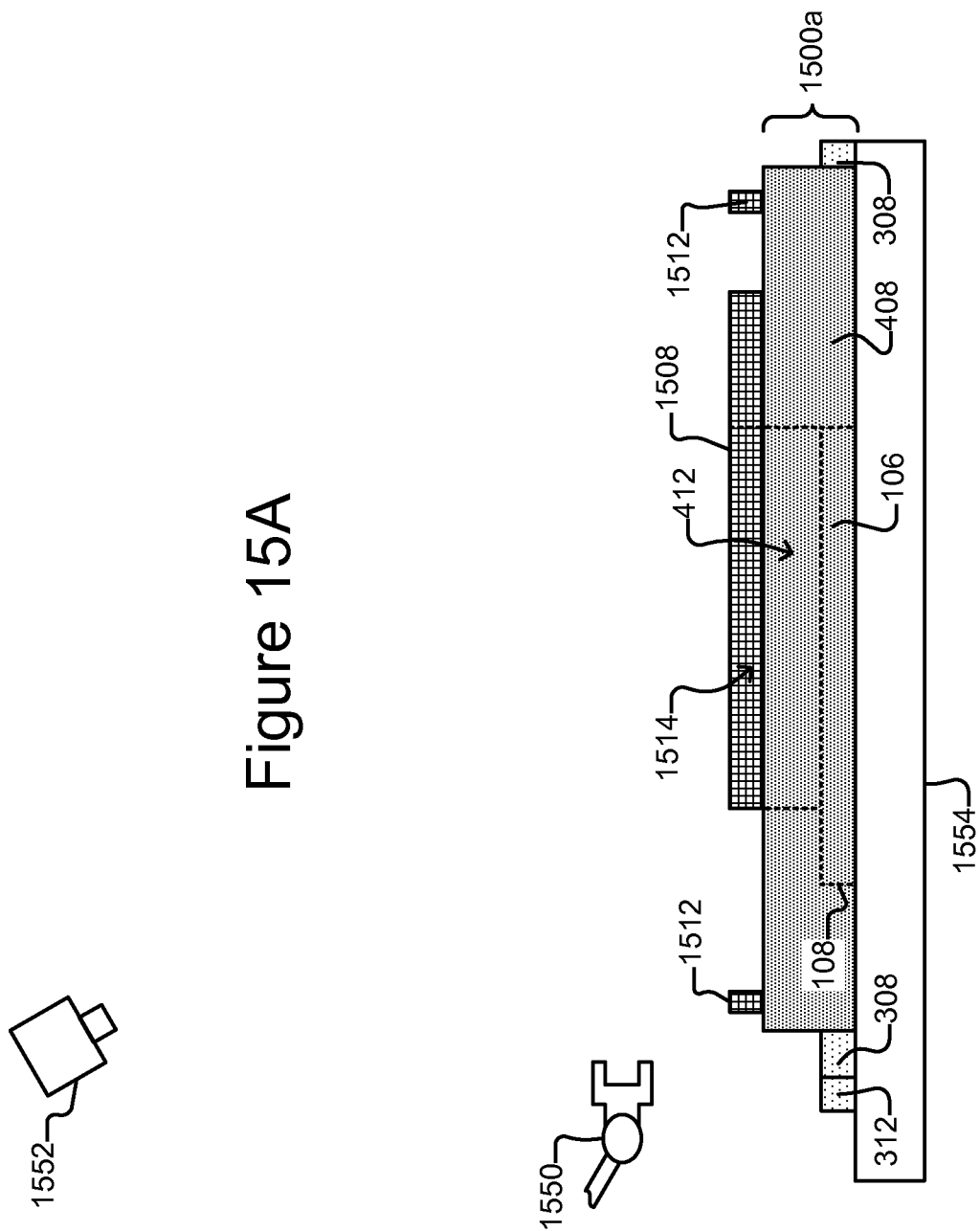
FIG. 15A shows a side view and FIG. 15B shows a top view of a first probe row frame structure on a rigid disposed on a support structure with adhesive material deposited on a frame of the first probe row frame structure according to some embodiments of the invention.
Figure 15B:
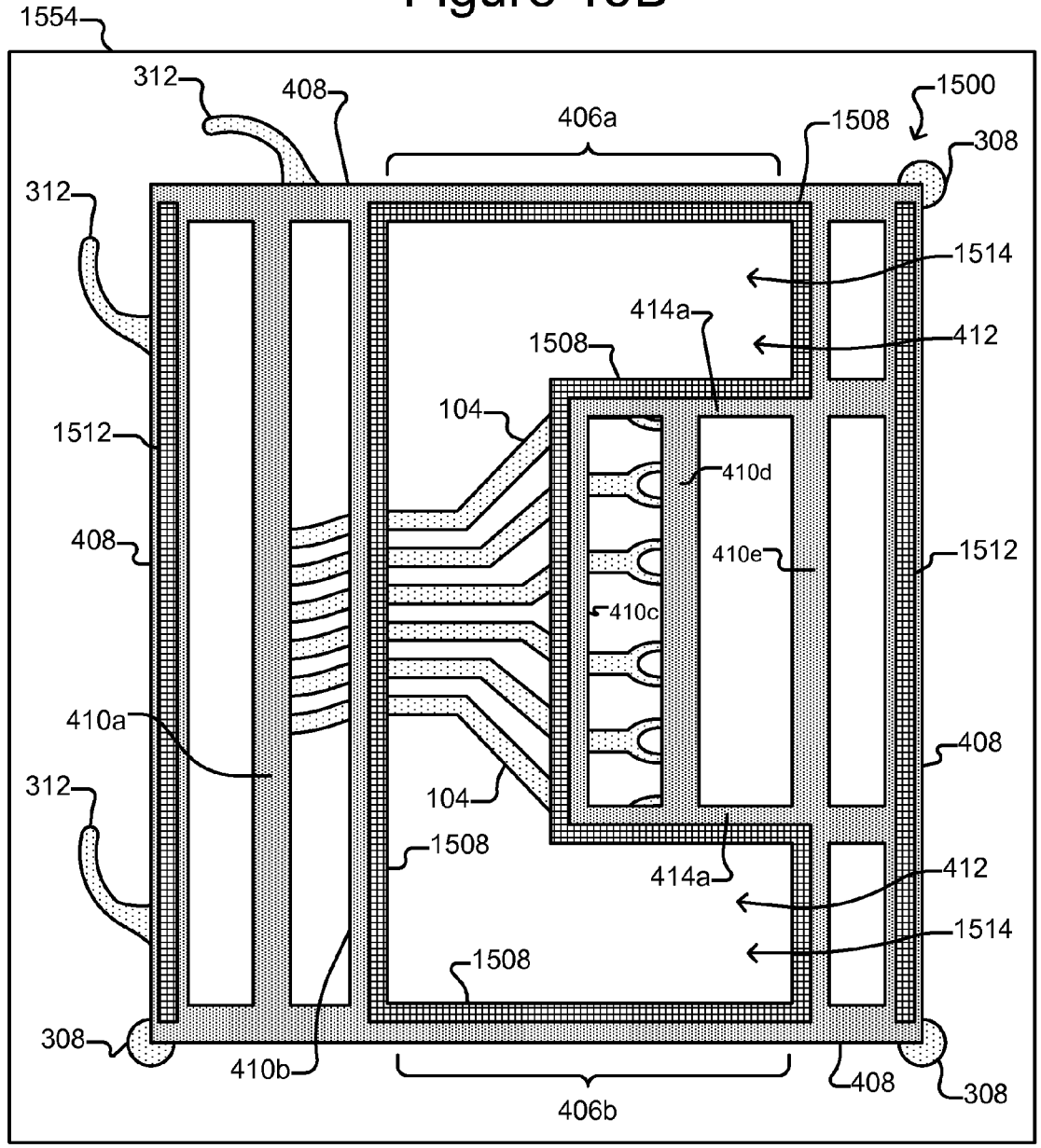

At 1404 of the process 1400 of FIG. 14, a first probe row frame structures 1500a obtained at 1402 can be placed on a rigid support structure 1554 as illustrated in FIGS. 15A and 15B. A handling mechanism 1550 (e.g., a pick and place mechanism such as those used to handle semiconductor dies) can grasp and move the probe row frame structure 1500a to a desired position on the support structure 1554. The handling mechanism 1550, which can be the same as or different than the handling mechanism 708) can grasp the first probe row structure 600a by the handling features 312. A sensing device 1552 (e.g., a camera) can be utilized to monitor the alignment features 308, which can be used to position the first probe row frame structure 1500a in a desired position. It is noted that one or more additional rigid support structures (e.g., like support structure 1554) can be provided to support and/or align the first probe row frame structure 1500a (and subsequent probe row frame structures 1500). For example, such additional rigid support structures can be positioned and oriented approximately 90 degrees with respect to the support structure 1554. The handling features 312 can also be used to align the probe row frame structures 1500. For example, the handling features 312, which as mentioned, can have spring-like properties, can be pressed against additional rigid support structures.

Referring again to the process 1400 of FIG. 14, at 1406, an adhesive material 1508 and 1512 can be deposited on the frame of the first probe row frame structure 1500a. An example is illustrated in FIGS. 15A and 15B. As shown, an adhesive material 1508 can be deposited on the frame 408 to form an enclosed cavity 1514 that is in the same or substantially the same location and shape as the enclosed cavity 412 discussed above with respect to FIG. 4A. Adhesive material 1512 can also be deposited as shown in FIG. 15B to provide increased stability in a stack of probe row frame structures 1500. The number, locations, and shapes of the adhesive material 1508 and 1512 deposits shown in FIG. 15B are examples only; a different number of adhesive material 1508 and 1512 deposits can be used, and those deposits can be in different locations and/or shapes than shown in FIG. 15B.

The adhesive material 1508 and 1512 can be a material that is sufficiently viscous to be deposited onto the probe row frame structures 1500 in an uncured stated and then hardens when cured. Examples of suitable adhesive materials include a thermal epoxy, a ultraviolet adhesive, or the like. For example, the adhesive material 1508 and 1512 can comprise a material available from Norland Products, Inc. of Cranbury, N.J. under the product name Norland Electronic Adhesive 123L. The adhesive material 1508 and 1512 can be deposited in any suitable manner. For example, the adhesive material 1508 and 1512 can deposited uncured using a dispenser, a print head, an applicator, or the like.

Referring again to the process 1400 of FIG. 14, at 1408, a second probe row frame structure 1500b can be placed in the adhesive material 1508 and 1512 on the first probe row frame structure 1500a. FIG. 16 illustrates an example. As shown, the second probe row frame structure 1500b can be grasped and moved into position by the handling mechanism 1550, which as discussed above, can grasp the second probe row frame structure 1500b by one or more of the handling features 312. The second probe row frame structure 1500b can be in contact with the adhesive material 1508 and 1512 but spaced apart from the first probe row frame structure 1500a by a desired distance $D_a$. The distance $D_a$ can be a desired distance between features (e.g., contact ends 108 of the row 114 of probe structures 104) of the first probe row frame structure 1500a and features (e.g., contact ends 108 of the row 114 of probe structures 104) of the second probe row frame structure 1500b. While the second probe row frame structure 1500b so positioned with respect to the first probe row frame structure 1500a, the cavities 412 and the cavities 1514 of the first probe substrate 1500a and the second probe substrate 1500b can be aligned with each other. The sensing device 1552 and the alignment features 308 of the first probe row frame structure 1500a and the second probe row frame structure 1500b can be used to position the second probe row frame structure 1500b.

Referring again to the process 1400 of FIG. 14, at 1410, the adhesive material 1508 and 1512 can be cured while the second probe row frame structure 1500b is held in the positioned it was placed in at 1408 of the process 1400. Once cured, the adhesive material 1508 and 1512 can securely hold the second probe row frame structure 1500b in place (that is, the position the second probe row frame structure 1500b was placed into at 1408 of the process 1400) with respect to the first probe row frame structure 1500a.

Figure 17:
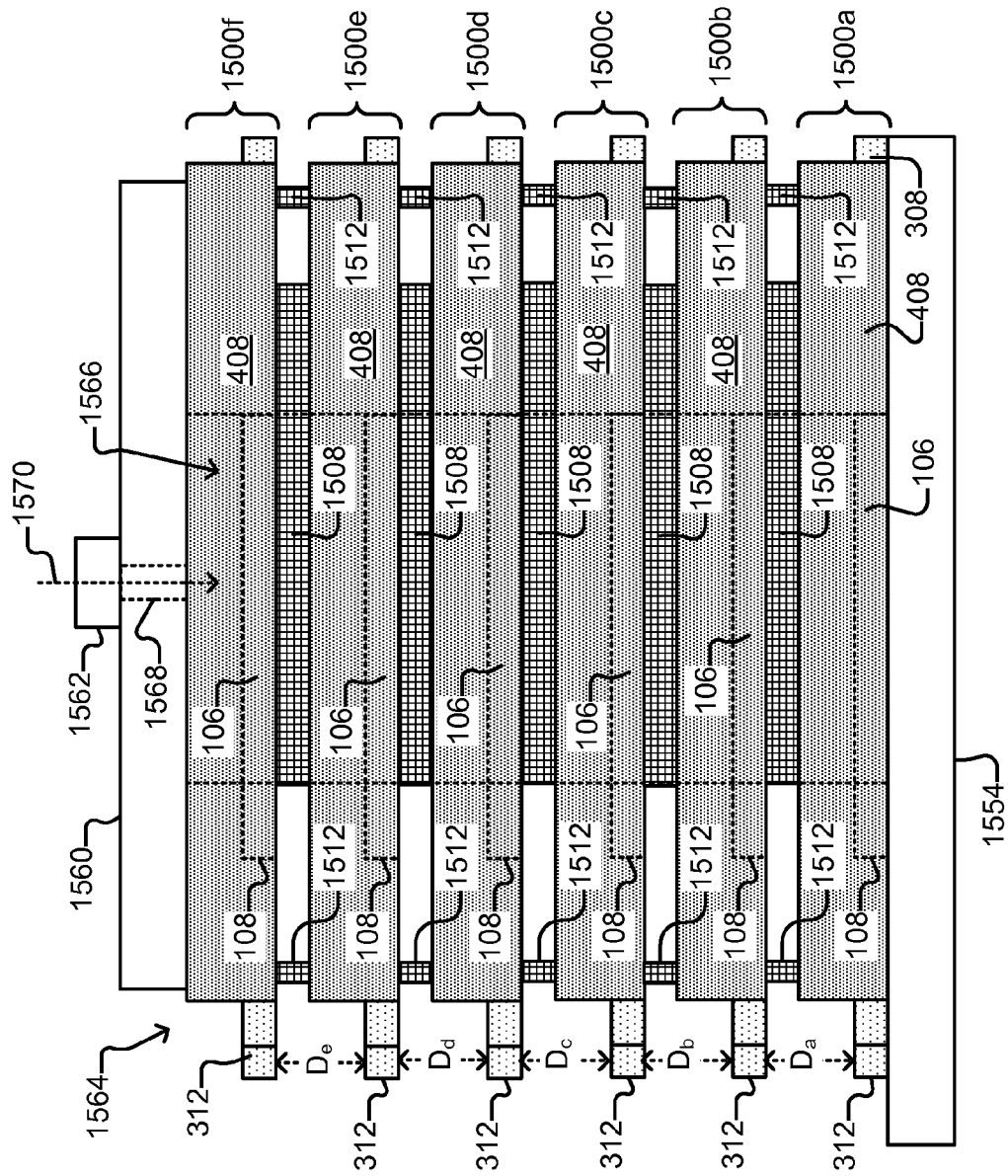
FIG. 17 shows an example in which additional probe row frame structures can be adhered to each other to form a stack of probe row frame structures adhered to each other in desired spaced relationships according to some embodiments of the invention.

As generally shown in FIG. 17, elements 1406, 1408, and 1410 of the process 1400 of FIG. 14 can be repeated to deposit adhesive material 1508 and 1512 on the frame 408 of the second probe frame substrate 1500b (element 1406 of FIG. 14), position a third probe frame substrate 1500c in the adhesive 1508 and 1512 on the frame 408 of the second probe frame substrate 1500b with a distance $D_b$ between features (e.g., the contact ends 108 of the row 114 of probe structures 104) of the third probe frame substrate 1500c and features (e.g., the contact ends 108 of the row 114 of probe structures 104) of the second probe frame substrate 1500b (1408), and cure the adhesive 1508 and 1512 (element 1410 of FIG. 14) generally as described above with respect to 1406, 1408 and 1410 of FIG. 14. The distance $D_b$ can be the same as or different than the distance $D_a$.

As also generally illustrated in FIG. 17, elements 1406, 1408, and 1410 of the process 1400 of FIG. 14 can be repeated additional times to create a stack 1564 of probe row frame structures 1500a, 1500b, 1500c, 1500d, 1500e, and 1500f with cured adhesive material 1508 and 1512 between and holding in place adjacent probe row frame structures 1500a, 1500b, 1500c, 1500d, 1500e, and 1500f in the stack 1564. As shown in FIG. 17, there can be a desired distance $D_a$, $D_b$, $D_c$, $D_d$, and $D_e$ between features (e.g., the contact ends 108 of the row 114 of probe structures 104) of adjacent probe frame substrates 1500a, 1500b, 1500c, 1500d, 1500e, and 1500f. The distances $D_a$, $D_b$, $D_c$, $D_d$, and $D_e$ can be the same or different distances. For example, any one of the distances $D_a$, $D_b$, $D_c$, $D_d$, and $D_e$ can be the same as, greater than, or less than any other of the distances $D_a$, $D_b$, $D_c$, $D_d$, and $D_e$ in the stack 1564. Although six probe row frame structures 1500a, 1500b, 1500c, 1500d, 1500e, and 1500f are shown in FIG. 17, the stack 1564 can have more or fewer probe row frame structures.

Rather than positioning the a subsequent probe frame substrate 1500 with respect to the immediately preceding probe frame substrate 1500 in the stack 1564, each subsequent probe frame substrate 1500 can be positioned with respect to the first probe frame substrate 1500a. This can avoid positioning errors from being additive within the stack 1564. For example, rather than positioning the third probe frame substrate 1500c by determining the distance $D_b$ from the second probe frame substrate 1500b, the third probe frame substrate 1500c can be positioned by determining a distance that is the sum of $D_b$ and $D_a$ from the first probe frame substrate 1500a. As another example, rather than positioning the fourth probe frame substrate 1500d by determining the distance $D_c$ from the third probe frame substrate 1500c, the fourth probe frame substrate 1500d can be positioned by determining a distance that is the sum of $D_c$, $D_b$, and $D_a$, which is the total distance from the first probe frame substrate 1500a to the fourth probe frame substrate 1500d.

The cavities 412 and the cavities 1514 of the all of the probe row frame structures 1500a, 1500b, 1500c, 1500d, 1500e, and 1500f can be aligned with each other and, with the rigid support structure 1554 and a mold end 1560 that includes an inlet port 1562 (which can be like the inlet port 712 of FIG. 7C) and a passage 1568 (which can be like the passage 714 of FIG. 7C) can form a mold 1566 that can be similar to the mold 800 of FIG. 8.

Referring again to the process 1400 of FIG. 14, at 1412, the probe substrate 102 (see FIGS. 1A and 1B) can be formed around the contact structures 104 in the stack 1564. A moldable material 1570 can be introduced into the mold 1566 through the inlet port 1562 and passage 1568. The moldable material 1570 can then be hardened (e.g., cured) to form the probe substrate 102 (see FIGS. 1A and 1B) around the probe structures 104. The moldable material 1570 can be any material that is sufficiently viscous to be introduced into the mold 1566 and then hardened. The moldable material 1570 can be the same as or similar to the moldable material 716 discussed above with respect to FIG. 8.

Referring again to the process 1400 of FIG. 14, at 1414, after the moldable material 1570 hardens to form the probe substrate 102 (see FIGS. 1A and 1B), the frame 408 (including cross bars 410a, 410b, 410c, 410d, 410e, 414a, and 414b), and adhesive 1508 and 1512 on each of the probe row frame structures 1500a, 1500b, 1500c, 1500d, 1500e, and 1500f can be removed, leaving substantially only the contact structures 104 and the probe substrate 102. The frame 408 (including cross bars 410a, 410b, 410c, 410d, 410e, 414a, and 414b), and adhesive 1508 and 1512 on each of the probe row frame structures 1500a, 1500b, 1500c, 1500d, 1500e, and 1500f can be removed in any suitable manner including any of the examples of ways for removing similar items discussed above with respect to 208 of FIG. 2. For example, the frame 408 (including cross bars 410a, 410b, 410c, 410d, 410e, 414a, and 414b), and adhesive 1508 and 1512 can be etched away or dissolved using a solvent that does not appreciably etch or dissolve the contact structures 104 or the probe substrate 102.

Figure 18:
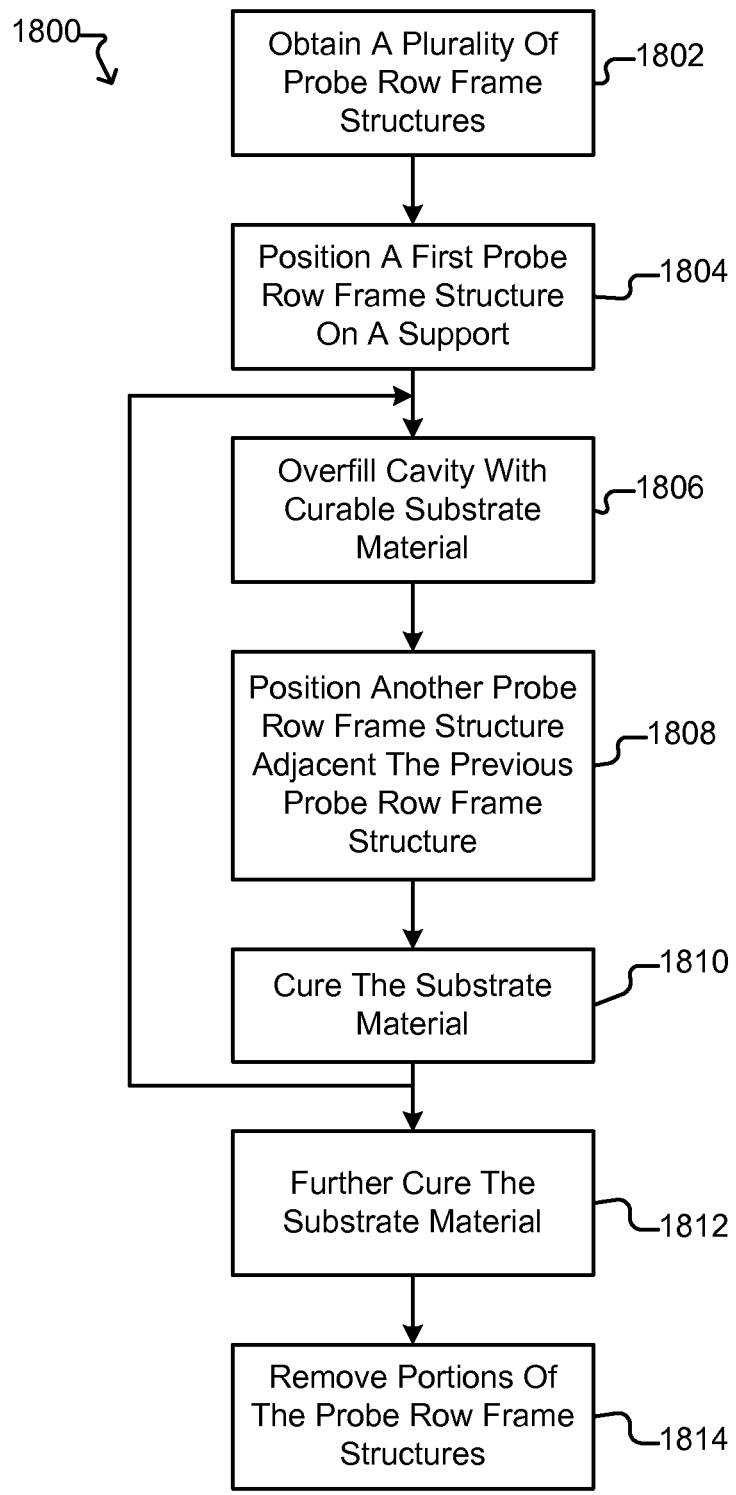
FIG. 18 illustrates another example of an alternative process for making the probe head of FIGS. 1A and 1B according to some embodiments of the invention

FIG. 18 illustrates a process 1800 that represents an example of yet another alternative to the process 200 for making the probe head 100 of FIGS. 1A and 1B. Process 1800 can also be used to make the space transformer 900 of FIG. 9. For ease of illustration and discussion, however, the process 1800 is discuss below with regard to making the probe head 100 of FIGS. 1A and 1B.

As shown in FIG. 18, a plurality of probe row frame structures can be obtained at 1802 of the process 1800. This can be the same as or similar to 1402 of the process 1400 of FIG. 14. For example, the probe row frame structures 1500a, 1500b, 1500c, 1500d, 1500e, and 1500f illustrated in FIGS. 15A, 15B, 16, and 17 and discussed above can be obtained at 1802 of the process 1800. The probe row frame structures 1500a, 1500b, 1500c, 1500d, 1500e, and 1500f, however, need not include the adhesive 1508 and 1512.

At 1804 of the process 1800 of FIG. 18, a first probe row frame structures 1500a obtained at 1802 can be placed on a rigid support structure 1554 as illustrated in FIG. 19. This can be accomplished in the same way that 1404 of the process 1400 of FIG. 14 is accomplished as discussed above. As noted above, one or more additional rigid support structures (e.g., like support structure 1554) can be provided to support and/or align the first probe row frame structure 1500a (and subsequent probe row frame structures 1500). For example, such additional rigid support structures can be positioned and oriented approximately 90 degrees with respect to the support structure 1554. The handling features 312 can also be used to align the probe row frame structure 1500a. For example, the handling features 312, which as mentioned, can have spring-like properties, can be pressed against additional rigid support structures.

Referring again to the process 1800 of FIG. 18, at 1806, a substrate material 1904a can be deposited into the enclosed cavity 412 in the frame 408 of the probe row frame structure 1500a discussed above with respect to FIG. 4A. As shown in FIG. 19, the substrate material 1904a can be dispensed through a print mechanism 1902 (e.g., an ink jet print head or other printing mechanism) into the cavity 412. Alternatively, the substrate material 1904a can be dispensed in other ways into the cavity 412. For example, the substrate material 1904a can be poured into the cavity or otherwise dispensed through a dispenser or applicator into the cavity 412. Regardless of how dispensed, the curable material 1904a can overfill the cavity 1412 such that some of the substrate material 1904a extends out of the cavity 412 as shown in FIG. 19. As will be seen, the substrate material 1904a can extend out of the cavity 412 by at least a distance that is greater than or equal to a desired distance between the first probe row frame structure 1500a and a second probe row frame structure 1500b to be positioned adjacent the first probe row frame structure 1500a (see FIG. 20).

In some embodiments, the substrate material 1904a can be a curable material that when uncured is sufficiently viscous to be dispensed through a printing mechanism 1902 such as an ink jet print head. The substrate material 1904a can also have other characteristics such as being curable by exposure to radiation (e.g., ultraviolet light) and being sufficiently rigid when cured to support contact structures 104 as contact ends 108 of the contact structure 104 are pressed against terminals of another electronic device (not shown) to make electrical connections with the terminals of the other electronic device. In some embodiments, the substrate material 1904a can be an optical adhesive. An example of a suitable substrate material 1904a includes a material available from Norland Products, Inc. of Cranbury, N.J. under the product name Norland Optical Adhesive NOA63.

Figure 20:
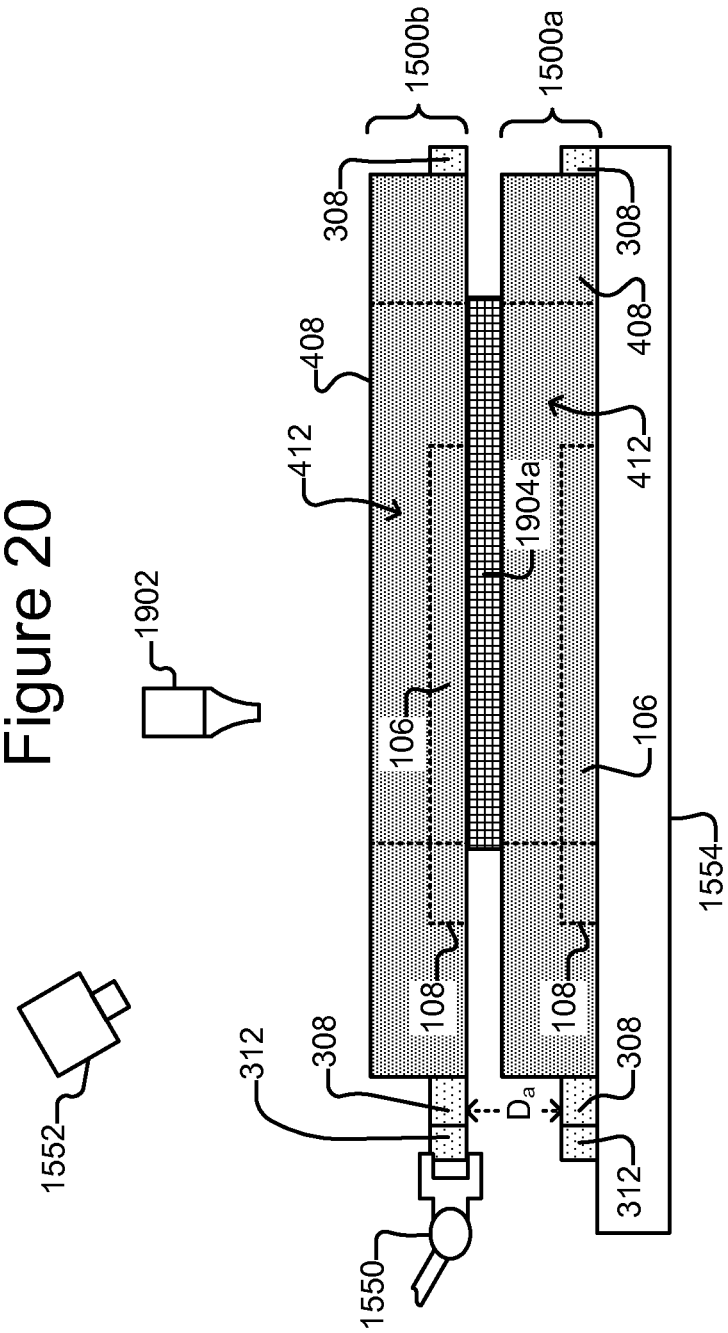
FIG. 20 shows an example in which a second probe row frame structure can be placed in the overfilled substrate material and positioned with respect to the first probe row frame structure in a desired spaced relationship according to some embodiments of the invention.

Referring again to the process 1800 of FIG. 18, at 1808, a second probe row frame structure 1500b can be placed in the substrate material 1904a that overfills and thus extends from the cavity 412 of the first probe row frame structure 1500a. FIG. 20 illustrates an example. As shown, the second probe row frame structure 1500b can be grasped and moved into position by the handling mechanism 1550, which as discussed above, can grasp the second probe row frame structure 1500b by one or more of the handling features 312. The second probe row frame structure 1500b can be in contact with the substrate material 1904a that overfills and thus extends from the cavity 412, while at the same time the second probe row frame structure 1500b is spaced apart from the first probe row frame structure 1500a by a desired distance $D_a$. The distance $D_a$ can be a desired distance between features (e.g., contact ends 108 of the row 114 of probe structures 104) of the first probe row frame structure 1500a and features (e.g., contact ends 108 of the row 114 of probe structures 104) of the second probe row frame structure 1500b. The sensing device 1552 and the alignment features 308 as well as the handling features 312 of the first probe row frame structure 1500a and the second probe row frame structure 1500b can be used to position the second probe row frame structure 1500b.

Referring again to the process 1800 of FIG. 18, at 1810, the substrate material 1904a can be cured while the second probe row frame structure 1500b is held in the position it was placed in at 1808 of the process 1800. In some embodiments, the substrate material 1904a can be less than one hundred percent cured. For example, in some embodiments, the substrate material 1904a can be eighty percent or less cured. In other embodiments, the substrate material 1904a can be more than eighty percent cured. Regardless, the substrate material 1904a can be cured at 1810 by exposing the substrate material 1904a to curing radiation (e.g., ultraviolet light). The curing at 1810 can harden the substrate material 1904a, creating a portion of the substrate 102 (see FIGS. 1A and 1B) disposed between the first probe row frame structure 1500b and the second probe row frame structure 1500a and around the portions of the contact structures 104 inside the cavity 412 of the first probe row frame structure 1500a.

As shown in FIG. 18, elements 1806, 1808, and 1810 of the process 1800 of FIG. 18 can be repeated. For example, while the second probe row frame structure 1500b is held (e.g., by the handling mechanism 1550) in the position it was placed in at 1808 of the process 1800, 1806 of the process 1800 can be repeated, and substrate material 1904b (which can be the same material as substrate material 1904a) can be deposited into the enclosed cavity 412 in the frame 408 of the second probe row frame structure 1500b in the same way that the substrate material 1904a was deposited into the cavity of the first probe row frame structure 1500a as discussed above. Similar to the substrate material 1904a, the substrate material 1904b can overfill the cavity 412 in the second probe row frame structure 1500b, and repeating 1808 of the process 1800, a third probe row frame structure 1500c (see FIG. 21)

can be placed in the substrate material 1904b that overfills and thus extends from the cavity 412 of the second probe row frame structure 1500b. The third probe row frame structure 1500c can be in contact with the substrate material 1904b that overfills and thus extends from the cavity 412, while at the same time the third probe row frame structure 1500c can be spaced apart from the second probe row frame structure 1500b by a desired distance $D_b$. The distance $D_b$ can be a desired distance between features (e.g., contact ends 108 of the row 114 of probe structures 104) of the second probe row frame structure 1500b and features (e.g., contact ends 108 of the row 114 of probe structures 104) of the third probe row frame structure 1500c. The distance $D_b$ can be the same as or different than the distance $D_a$. Repeating element 1810 of the process 1800, the substrate material 1904b can be cured while the third probe row frame structure 1500b is held in the position it was placed in at 1808 of the process 1800. This curing can also cross link the substrate materials 1904a and 1904b and thus fuse the substrate materials 1904a and 1904b together. In some embodiments, the substrate material 1904b can be less than one hundred percent cured. For example, in some embodiments, the substrate material 1904b can be eighty percent or less cured. In other embodiments, the substrate material 1904b can be more than eighty percent cured. Regardless, the substrate material 1904b can be cured at 1810 by exposing the substrate material 1904b to curing radiation (e.g., ultraviolet light). The curing at 1810 can harden the substrate material 1904b, creating another portion of the substrate 102 (see FIGS. 1A and 1B) disposed between the third probe row frame structure 1500c and the second probe row frame structure 1500b and around the portions of the contact structures 104 inside the cavity 412 of the second probe row frame structure 1500b. During the repetition of 1810, the curable material 1904a can be further cured.

Figure 21:
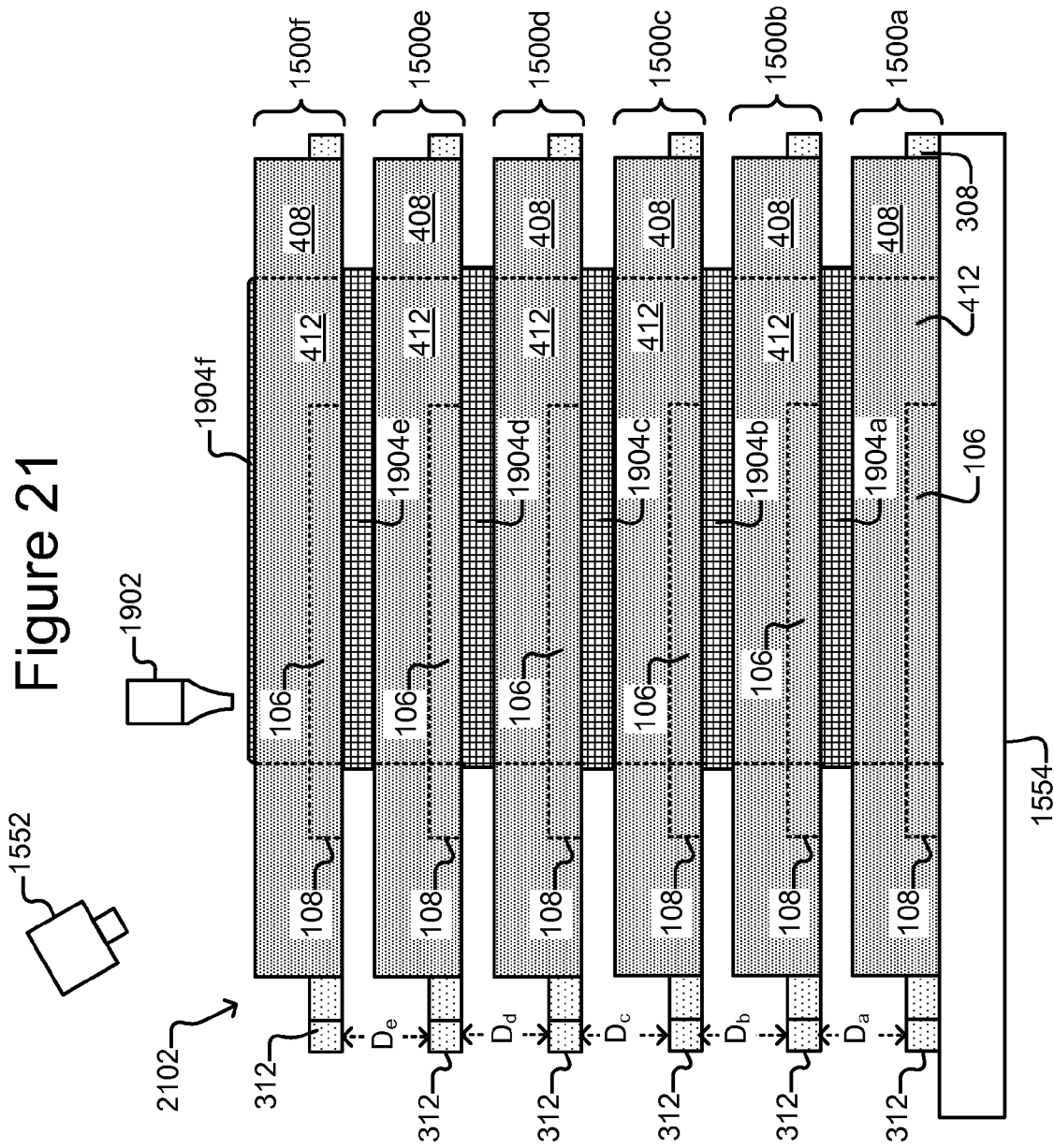
FIG. 21 shows an example in which cavities in additional probe row frame structures can be overfilled with the substrate material, and the additional probe row frame structures can be positioned in desired spaced relationships with one another to form a stack of probe row frame structures embedded in the substrate material according to some embodiments of the invention.

As generally illustrated in FIG. 21, elements 1806, 1808, and 1810 of the process 1800 of FIG. 18 can be repeated additional times to create a stack 2102 of probe row frame structures 1500a, 1500b, 1500c, 1500d, 1500e, and 1500f with cured substrate material 1904a, 1904b, 1904c, 1904d, 1904e, and 1904f in and between the cavities 412 in adjacent probe row frame structures 1500a, 1500b, 1500c, 1500d, 1500e, and 1500f in the stack 2102. The curing at each repetition of 1810 of the process 1800 can not only cure the substrate material 1904a, 1904b, 1904c, 1904d, 1904e, and 1904f but can also cross-link adjacent ones of the substrate material 1904a, 1904b, 1904c, 1904d, 1904e, and 1904f. The cured substrate material 1904a, 1904b, 1904c, 1904d, 1904e, and 1904f, cross linked together, can thus form the substrate 102 (see FIGS. 1A and 1B) enclosing the contact structures 104 of the probe row frame structures 1500a, 1500b, 1500c, 1500d, 1500e, and 1500f. As shown in FIG. 21, there can be a desired distance $D_a$, $D_b$, $D_c$, $D_d$, and $D_e$ between features (e.g., the contact ends 108 of the row 114 of probe structures 104) of adjacent probe frame substrates 1500a, 1500b, 1500c, 1500d, 1500e, and 1500f. The distances $D_a$, $D_b$, $D_c$, $D_d$, and $D_e$ can be the same or different distances. For example, any one of the distances $D_a$, $D_b$, $D_c$, $D_d$, and $D_e$ can be the same as, greater than, or less than any other of the distances $D_a$, $D_b$, $D_c$, $D_d$, and $D_e$ in the stack 1564. Although six probe row frame structures 1500a, 1500b, 1500c, 1500d, 1500e, and 1500f are shown in FIG. 21, the stack 2102 can have more or fewer probe row frame structures 1500.

As generally discussed above with respect to the stack 1564 of FIG. 17, rather than positioning the a subsequent probe frame substrate 1500 with respect to the immediately preceding probe frame substrate 1500 in the stack 2102, each subsequent probe frame substrate 1500 can be positioned with respect to the first probe frame substrate 1500a. This can avoid positioning errors from being additive within the stack 2102. For example, rather than positioning the third probe frame substrate 1500c by determining the distance $D_b$ from the second probe frame substrate 1500b, the third probe frame substrate 1500c can be positioned by determining a distance that is the sum of $D_b$ and $D_a$ from the first probe frame substrate 1500a. As another example, rather than positioning the fourth probe frame substrate 1500d by determining the distance $D_c$ from the third probe frame substrate 1500c, the fourth probe frame substrate 1500d can be positioned by determining a distance that is the sum of $D_c$, $D_b$, and $D_a$, which is the total distance from the first probe frame substrate 1500a to the fourth probe frame substrate 1500d.

Referring again to the process 1800 of FIG. 18, at 1812, the substrate material 1904a, 1904b, 1904c, 1904d, 1904e, and 1904f already cured at 1810 of the process 1800 can be further cured. For example, the substrate material 1904a, 1904b, 1904c, 1904d, 1904e, and 1904f can be further cured by being further exposed to curing radiation (e.g., ultraviolet light). Alternatively, the substrate material 1904a, 1904b, 1904c, 1904d, 1904e, and 1904f can be further cured by being exposed to heat.

At 1814 of the process 1400 of FIG. 18, after the substrate material 1904a, 1904b, 1904c, 1904d, 1904e, and 1904f are fully cured, the frame 408 (including cross bars 410a, 410b, 410c, 410d, 410e, 414a, and 414b) of each of the probe row frame structures 1500a, 1500b, 1500c, 1500d, 1500e, and 1500f can be removed, leaving substantially only the contact structures 104 and the cured substrate material 1904a, 1904b, 1904c, 1904d, 1904e, and 1904f hardened and cross-linked to each other, which can be the probe substrate 102 of FIGS. 1A and 1B. The frame 408 (including cross bars 410a, 410b, 410c, 410d, 410e, 414a, and 414b) of each of the probe row frame structures 1500a, 1500b, 1500c, 1500d, 1500e, and 1500f can be removed generally as described above with respect to 1414 of FIG. 14.

As mentioned above, the space transformer 900 of FIG. 9 can be made using the process 200 of FIG. 2. Alternatively, the space transformer 900 can be made using the process 1400 of FIG. 14 or the process 1800 of FIG. 18.

Figure 22:
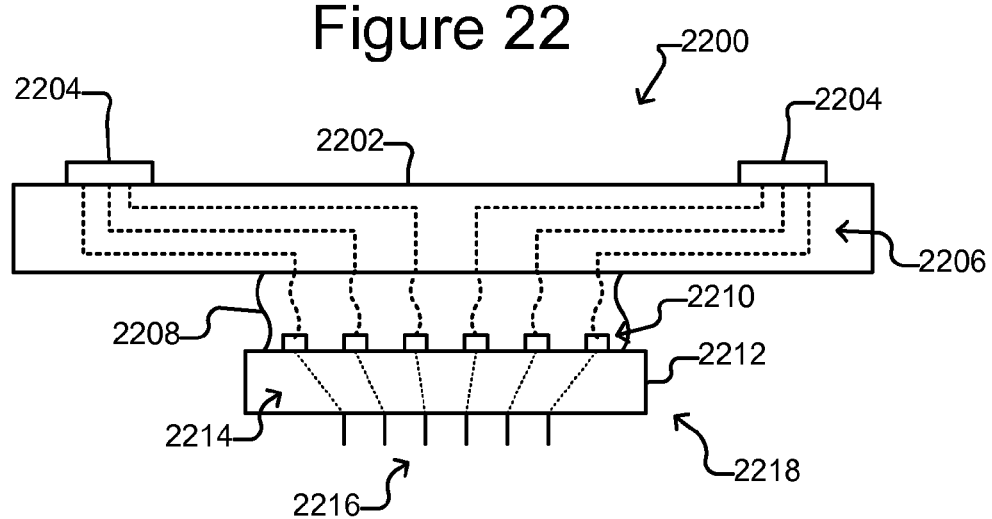
FIG. 22 illustrates a probe card assembly a component of which can be the probe head of FIGS. 1A and 1B or the composite probe head of FIGS. 10A, 10B, 10C, 11A, and 11B according to some embodiments of the invention.
Figure 23:
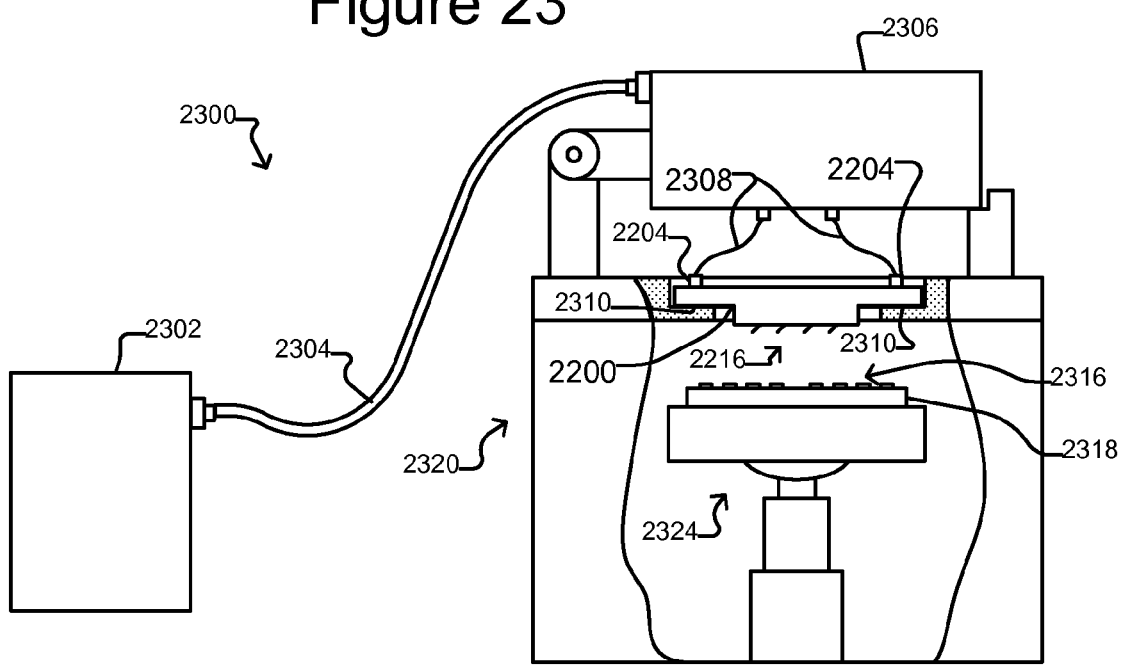
FIG. 23 shows an example of a test system in which the probe card assembly of FIG. 22 can be used to test DUTs according to some embodiments of the invention.

Regardless of how made, the probe head 100 and/or the composite probe head 1000 can be used in many different applications. For example, the probe head 100 and/or the composite probe head 1000 can be used in applications in which the contact ends 108 of the probe portions 106 of the contact structures 104 are pressed against and thereby form pressure based electrical connections with terminals of an electronic device (not shown). The probe portions 106 can exhibit primarily elastic behavior and can thus function mechanically as spring contacts. FIGS. 22 and 23 illustrate an example.

FIG. 22 illustrates an example of a probe card assembly 2200 that can be used to test devices under test (DUTs) such as semiconductor dies (e.g., singulated or unsingulated from the wafer on which the dies were made, packaged or unpackaged) or other electronic devices with input and output terminals. As shown in FIG. 22, the probe card assembly 2200 can include a probe head 2218, which can comprise electrically conductive probes 2216 coupled to a probe substrate 2212. The probes 2216 can be electrically conductive and exhibit primarily elastic behavior when pressed against terminals of DUTs like terminals 2316 of DUTs 2318 in FIG. 23 to make electrical connections with the terminals. Electrical connections 2214 through the probe substrate 2212 can electrically connect the probes 2216 to terminals 2210 on the probe substrate 2212 as shown in FIG. 22. An electrical connector 2208 can electrically connect the terminals 2210 to electrical connections 2206 through a wiring substrate 2202 to an electrical interface 2204 on the wiring substrate 2202.

The electrical interface 2204 can comprise a plurality of electrical connectors that can be connected to individual communications channels to and from a test controller like the test controller 2302 in FIG. 23. For example, the electrical interface 2204 can comprise zero-insertion-force (ZIF) electrical connectors, pogo pin pads, or other such electrical connectors. The wiring substrate 2202 can be a wiring board such as a printed circuit board or the like. The electrical connections 2206 through the wiring substrate 2202 can be conductive vias and/or traces on and/or in the wiring substrate 2202. The electrical connector 2208 can comprise a plurality of electrical connections between ones of the electrical connections 2206 and the terminals 2210. The electrical connector 2208 can be any device or collection of electrical connectors suitable for connecting the electrical connections 2206 to the terminals 2210. For example, the electrical connector 2208 can comprise an interposer, wires, solder, or the like.

The probe head 100 of FIGS. 1A and 1B can be the probe head 2212 in FIG. 22, in which case the probe substrate 102 can be the probe substrate 2212, the probe portions 106 can be the probes 2216, the body portions 110 can be the electrical connections 2214, and the connector portions 112 can be the terminals 2210. (See FIGS. 1A and 1B.) Alternatively, the composite probe head 1000 of FIGS. 10A, 10B, 10C, 11A, and 11B can be the probe head 2212 in FIG. 22, in which case the probe substrate 102 and substrate 902 coupled together can be the probe substrate 2212; the probe portions 106 can be the probes 2216; the body portions 110 and connector portions 112 coupled to the conductors 904 can be the electrical connections 2214; and the contactor portions 912 can be the terminals 2210. (See FIGS. 10A, 10B, and 10C.)

As mentioned, the probe card assembly 2200 of FIG. 22 can be used to test electronic devices such as DUTS 2318 in FIG. 23, which illustrates an example of a test system 2300 in which the probe card assembly 2200 can be used. As shown in FIG. 23, the test system 2300 can include a test controller 2302, which can provide input signals to the DUTs 2318 and can receive response signals generated by the DUTs 2318 in response to the input signals. The term "test signals" can refer generically to either or both the input signals generated by the test controller 2302 and the response signals generated by the DUTs 2318. The probe card assembly 2200 can be coupled to a mounting mechanism 2310 of a housing 2320 (e.g., a prober) of the test system 2300. The probes 2216 of the probe card assembly 2200 can make pressure-based electrical connections with terminals 2316 of the DUTs 2318, and the test signals can be passed between the test controller 2302 and the DUTs 2318 through communication connections 2304 (e.g., a coaxial cable, a wireless link, a fiber optic link, etc.), electronics (not shown) in a test head 2306, electrical connections 2308 between the test head 2306 and the electrical interface 2204, and the probe card assembly 2200.

The DUTs 2318 can be tested as follows. The probe card assembly 2200 can be coupled to the mounting mechanism 2310 of the housing 2320, and terminals 2316 of the DUTs 2318 can be brought into contact with the probes 2216 of the probe card assembly 2200. This can be accomplished by moving the chuck 2324 on which the DUTs 2318 are disposed such that terminals 2316 of the DUTs 2318 are pressed against probes 2216 of the probe card assembly 2200. Alternatively, the probe card assembly 2200 can be moved, or both the chuck 2324 and the probe card assembly 2200 can be moved to effect contact between the terminals 2316 and the probes 2216.

While the probes 2216 and terminals 2316 are in contact, the DUTs 2318 can be tested by providing test signals (which, as discussed above, can include input signals generated by the test controller 2302 and response signals generated by the DUTs 2318 in response to the input signals) between the test controller 2302 and the DUTs 2318 through the probe card assembly 2200. The test controller 2302 can analyze the response signals to determine whether the DUTs 2318 pass the testing. For example, the test controller 2302 can compare the response signals to expected response signals. If the response signals match the expected response signals, the test controller 2302 can determine that the DUTs 2318 passed the testing. Otherwise, the test controller 2302 can determine that the DUTs 2318 failed the testing. As another example, the test controller 2302 can determine whether the response signals are within acceptable ranges, and if so, can determine that the DUTs 2318 passed the testing.

The probe card assembly 2200 of FIG. 23 is an example only, and probe head 100 of FIGS. 1A and 1B or the composite probe head 1000 of FIGS. 10A, 10B, 10C, 11A, and 11B can be used in other electronic devices such as a different probe card or test contactor. The test system 2300 of FIG. 23 is also an example only, and the probe card assembly 2200 of FIG. 22 can be used in other test systems.

Although specific embodiments and applications of the invention have been described in this specification, these embodiments and applications are exemplary only, and many variations are possible.

We claim:

1. A method of making a probing device, the method comprising:
    obtaining a plurality of probe row structures each comprising:
        a frame,
        a plurality of electrically conductive contact structures coupled to the frame in a pattern in which contact ends of each of the contact structures are disposed in a row, and
        a compressible shim coupled to the frame;
    disposing the probe row structures into a stack in which the rows of contact ends of the contact structures are in an array;
    compressing the stack and thereby compressing the compressible shims of each probe row structure until a distance between outer ones of the rows of the contact ends are a particular distance apart;
    securing the contact structures in place while maintaining the particular distance between the outer ones of the rows; and
    removing the frames from the contact structures.

2. The method of claim 1, wherein the securing comprises molding a substrate around body portions of the contact structures such that probe portions terminating in the contact ends of the contact structures extend from a first surface of the substrate and connector portions of the contact structures extend from a second surface of the substrate opposite the first surface.

3. The method of claim 2, wherein:
    the disposing the probe row structures into the stack comprises orienting each of the probe row structures such that cavities in the probe row structures align to form a mold in which the body portions of the contact structures are disposed; and
    the molding the substrate comprises introducing a moldable material into the mold.

4. The method of claim 3, wherein:
the frame of each probe row structure comprises an enclosed portion that forms a first cavity;
the shim of each probe row structure is disposed on the enclosed portion of the frame and forms a second cavity aligned with the first cavity; and
the cavity in each of the probe row structures comprises the first cavity and the second cavity.

5. The method of claim 4, wherein the removing the frames comprises dissolving the frames and the shims coupled to the frames.

6. The method of claim 4, wherein:
the compressing the stack comprises compressing the stack between two compressing mechanisms; and
the mold comprises portions of the compressing mechanisms.

7. The method of claim 1, wherein the obtaining a plurality of probe row structures comprises making each of the probe row structures by at least:
forming the plurality of contact structures at least by depositing contact material in openings in a first masking material on a substrate;
forming the frame at least by depositing frame material in openings in a second masking material on the row of contact structures and the substrate;
forming the compressible shim at least by depositing compressible material into openings in a third masking material on the frame; and
releasing the row of contact structures and the frame from the substrate.

8. The method of claim 7, wherein the forming the row of contact structures comprises forming the contact structures such that:
the contact ends of adjacent ones of the contact structures are a first distance apart,
ends of the adjacent ones of the contact structures that are opposite the ends of the contact ends are a second distance apart, and
the second distance is greater than the first distance.

9. The method of claim 1, wherein the disposing the probe row structures into the stack comprises disposing each of the probe row structures in the stack such that the rows of contact ends are substantially parallel.

10. The method of claim 9, wherein:
after the disposing the probe row structures into the stack but prior to the compressing the stack, the distance between the outer ones of the rows of the contact ends is greater than the particular distance; and
the method further comprises, while compressing the stack, monitoring the distance between the outer ones of the rows of the contact ends.

11. The method of claim 1, wherein the particular distance is less than or equal to forty microns.

12. The method of claim 11, wherein in each of the rows of contact ends, adjacent contact ends are less than or equal to forty microns apart.

* * * * *